(12) United States Patent
Li

(10) Patent No.: US 12,119,297 B2
(45) Date of Patent: *Oct. 15, 2024

(54) SEMICONDUCTOR DEVICE WITH MULTI-STACKING CARRIER STRUCTURE

(71) Applicant: NANYA TECHNOLOGY CORPORATION, New Taipei (TW)

(72) Inventor: Wei-Zhong Li, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 442 days.

This patent is subject to a terminal disclaimer.

(21) Appl. No.: 17/561,151

(22) Filed: Dec. 23, 2021

(65) Prior Publication Data

US 2023/0207453 A1  Jun. 29, 2023

(51) Int. Cl.
*H01L 23/522* (2006.01)
*H01L 23/532* (2006.01)

(52) U.S. Cl.
CPC .... *H01L 23/5226* (2013.01); *H01L 23/53295* (2013.01)

(58) Field of Classification Search
CPC .......... H01L 23/5226; H01L 23/53295; H01L 21/76802; H01L 21/76829; H01L 21/76877
See application file for complete search history.

(56) References Cited

U.S. PATENT DOCUMENTS 6,509,267 B1 * 1/2003 Woo .................. H01L 21/76801
438/678
11,521,915 B2 * 12/2022 Wang .................... H01L 23/535

2015/0235915 A1    8/2015  Liang et al.
2015/0364386 A1   12/2015  Yu et al.
2019/0067149 A1 *  2/2019  Wang ............... H01L 21/76895
2020/0251149 A1    8/2020  Zhang et al.
2020/0402960 A1   12/2020  Chen et al.
2021/0057332 A1    2/2021  Chen et al.
2021/0249296 A1    8/2021  Or-Bach et al.
2022/0130721 A1 *  4/2022  Bouche ............ H01L 21/76844
2022/0302081 A1    9/2022  Hsu et al.
2022/0328447 A1   10/2022  Kao et al.
2023/0207452 A1 *  6/2023  Li ..................... H01L 23/53295
257/210
2024/0038626 A1    2/2024  Chang et al.

FOREIGN PATENT DOCUMENTS

| TW | 202105629 A | 2/2021 |
| TW | 202115869 A | 4/2021 |
| TW | 202135231 A | 9/2021 |
| TW | I741396 B | 10/2021 |
| TW | 202145391 A | 12/2021 |

OTHER PUBLICATIONS

Machine translation of TW202135231A cited in IDS dated Feb. 17, 2023 publisehd Sep. 2021.*

* cited by examiner

Primary Examiner — Jaehwan Oh
Assistant Examiner — John M Parker
(74) Attorney, Agent, or Firm — MUNCY, GEISSLER, OLDS & LOWE, P.C.

(57) ABSTRACT

The present application discloses a semiconductor device and a method for fabricating the semiconductor device. The semiconductor device includes an inter-dielectric layer on a substrate; a conductive pad in the inter-dielectric layer; and a multi-stacking carrier structure including a first tier on the inter-dielectric layer, a second tier on the first tier, and a third tier on the second tier.

18 Claims, 33 Drawing Sheets

SEMICONDUCTOR DEVICE WITH MULTI-STACKING CARRIER STRUCTURE

TECHNICAL FIELD

The present disclosure relates to a semiconductor device, and more particularly, to a semiconductor device with a multi-stacking carrier structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; an inter-dielectric layer positioned on the substrate; a conductive pad positioned in the inter-dielectric layer; and a multi-stacking carrier structure comprising a first tier comprising a first passivation layer positioned on the inter-dielectric layer, a first insulating layer positioned on the first passivation layer, and a first via positioned along the first passivation layer and the first insulating layer, and electrically connected to the conductive pad; a second tier positioned on the first tier and comprising a second passivation layer positioned on the first insulating layer, a second insulating layer positioned on the second passivation layer, and a second via positioned along the second passivation layer and the second insulating layer, and electrically connected to the first via; and a third tier positioned on the second tier and comprising a third passivation layer positioned on the second insulating layer, a third insulating layer positioned on the third passivation layer, and a third via positioned along the third passivation layer and the third insulating layer, and electrically connected to the second via.

Another aspect of the present disclosure provides a multi-stacking carrier structure including an etch stop layer; a first tier comprising a first passivation layer positioned on the etch stop layer, a first insulating layer positioned on the first passivation layer, and a first via positioned along the first passivation layer and the first insulating layer; a second tier positioned on the first tier and comprising a second passivation layer positioned on the first insulating layer, a second insulating layer positioned on the second passivation layer, and a second via positioned along the second passivation layer and the second insulating layer, and electrically connected to the first via; and a third tier positioned on the second tier and comprising a third passivation layer positioned on the second insulating layer, a third insulating layer positioned on the third passivation layer, and a third via positioned along the third passivation layer and the third insulating layer, and electrically connected to the second via.

Another aspect of the present disclosure provides a method for fabricating a semiconductor device including providing a substrate; forming an inter-dielectric layer on the substrate; forming a conductive pad in the inter-dielectric layer; forming a first tier on the inter-dielectric layer, wherein the first tier comprises a first passivation layer on the inter-dielectric layer, a first insulating layer on the first passivation layer, and a first via along the first passivation layer and the first insulating layer, and electrically connected to the conductive pad; forming a second tier on the first tier, wherein the second tier comprises a second passivation layer on the first insulating layer, a second insulating layer on the second passivation layer, and a second via along the second passivation layer and the second insulating layer, and electrically connected to the first via; and forming a third tier on the second tier, wherein the third tier comprises a third passivation layer on the second insulating layer, a third insulating layer on the third passivation layer, and a third via along the third passivation layer and the third insulating layer, and electrically connected to the second via. The first tier, the second tier, and the third tier together configure a multi-stacking carrier structure.

Another aspect of the present disclosure provides a method for fabricating a semiconductor device including providing a sacrificial carrier; temporarily attaching an etch stop layer on the sacrificial carrier; forming a multi-stacking carrier structure on the etch stop layer, wherein the multi-stacking carrier structure comprises a first tier on the etch stop layer, a second tier on the first tier, and a third tier on the second tier; providing a substrate; forming an inter-dielectric layer on the substrate; forming a conductive pad in the inter-dielectric layer; flipping the multi-stacking carrier structure and bonding the multi-stacking carrier structure onto the inter-dielectric layer; detaching the sacrificial carrier from the etch stop layer; and thinning the substrate.

Due to the design of the semiconductor device of the present disclosure, the multi-stacking carrier structure may serve as a temporary carrier to assist a thinning process of the substrate. Therefore, no carrier is needed during the thinning process of the substrate. As a result, the cost of fabricating of the semiconductor device may be reduced. In addition, after the thinning process, the multi-stacking carrier structure may provide an electrical path connecting to device elements of the semiconductor device. As a result, the performance of the semiconductor device may be easily analyzed in the presence of the multi-stacking carrier structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
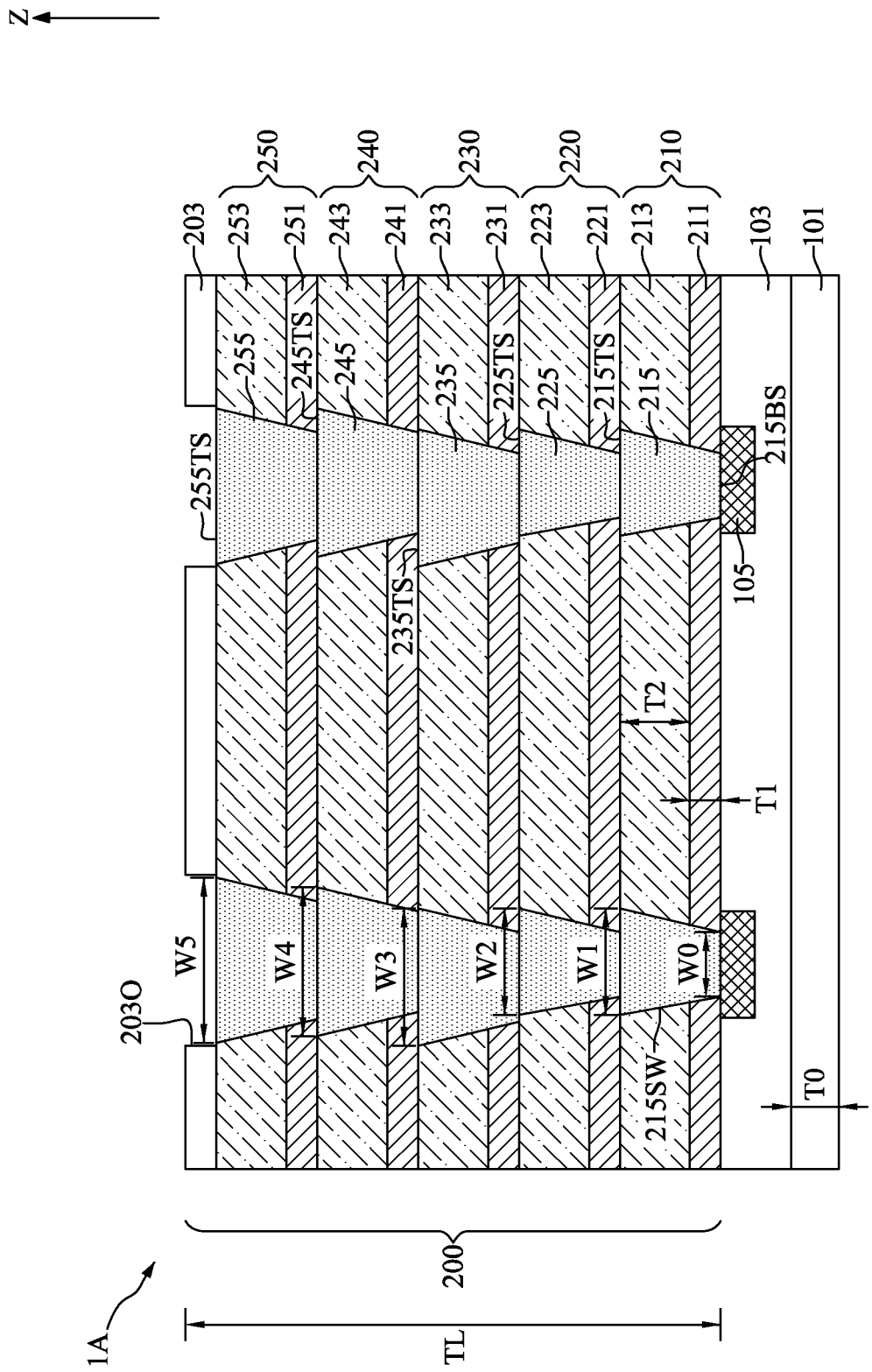
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
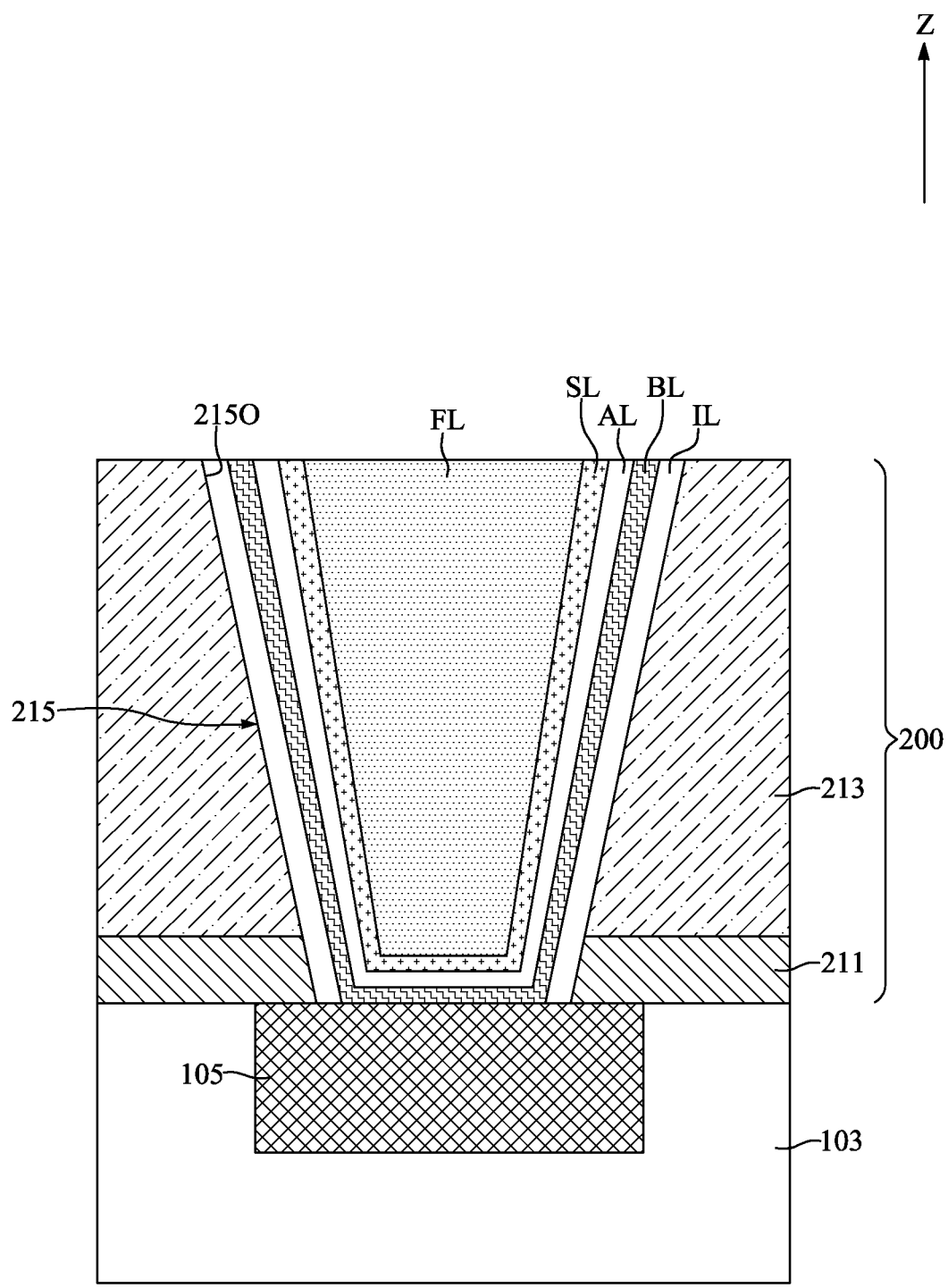
FIG. 2 illustrates, in a schematic close-up cross-sectional view diagram, a first via of the semiconductor device in accordance with one embodiment of the present disclosure.
Figure 3:
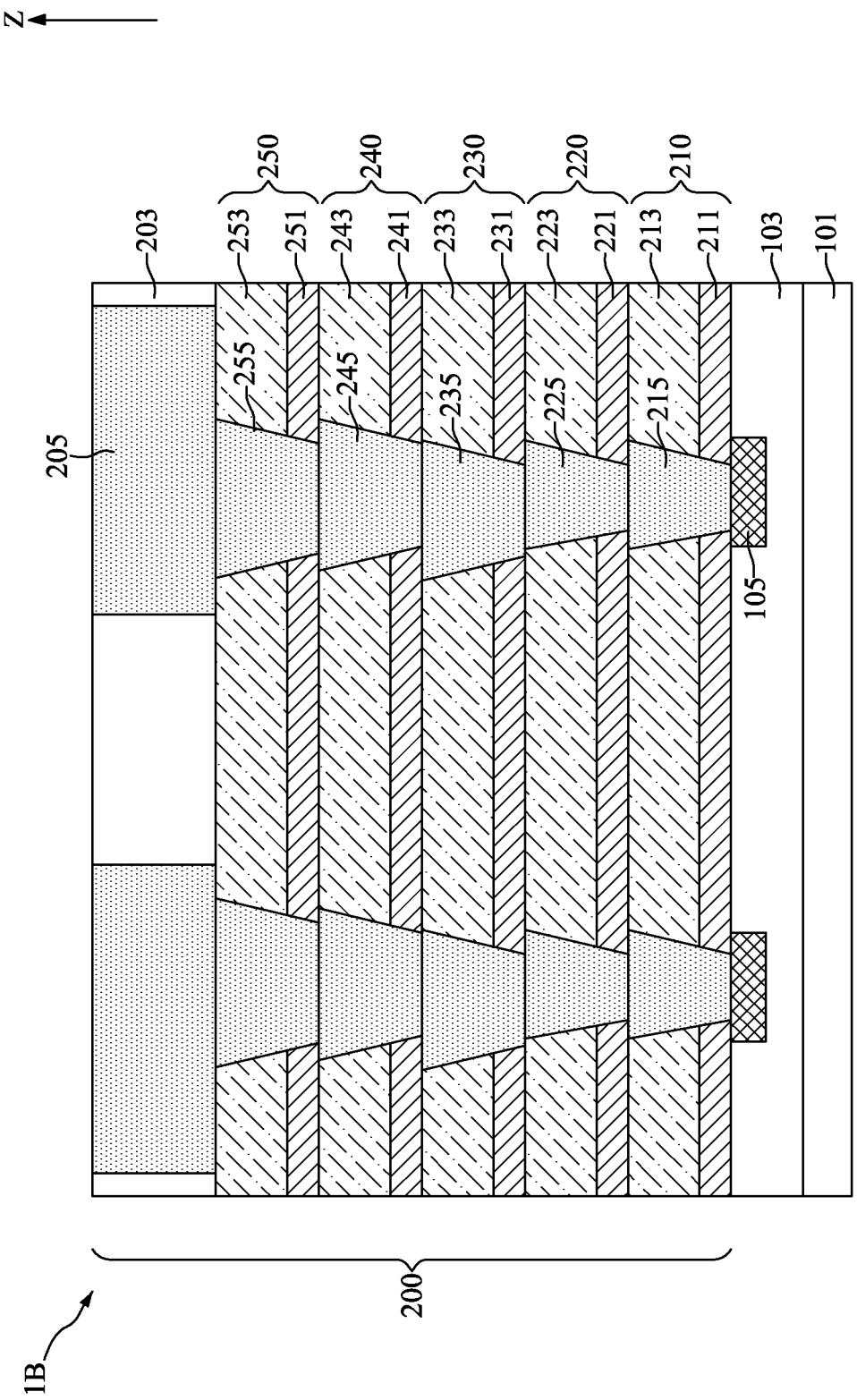
FIGS. 3 to 5 illustrate, in schematic cross-sectional view diagrams, semiconductor devices in accordance with some embodiments of the present disclosure.
Figure 4:
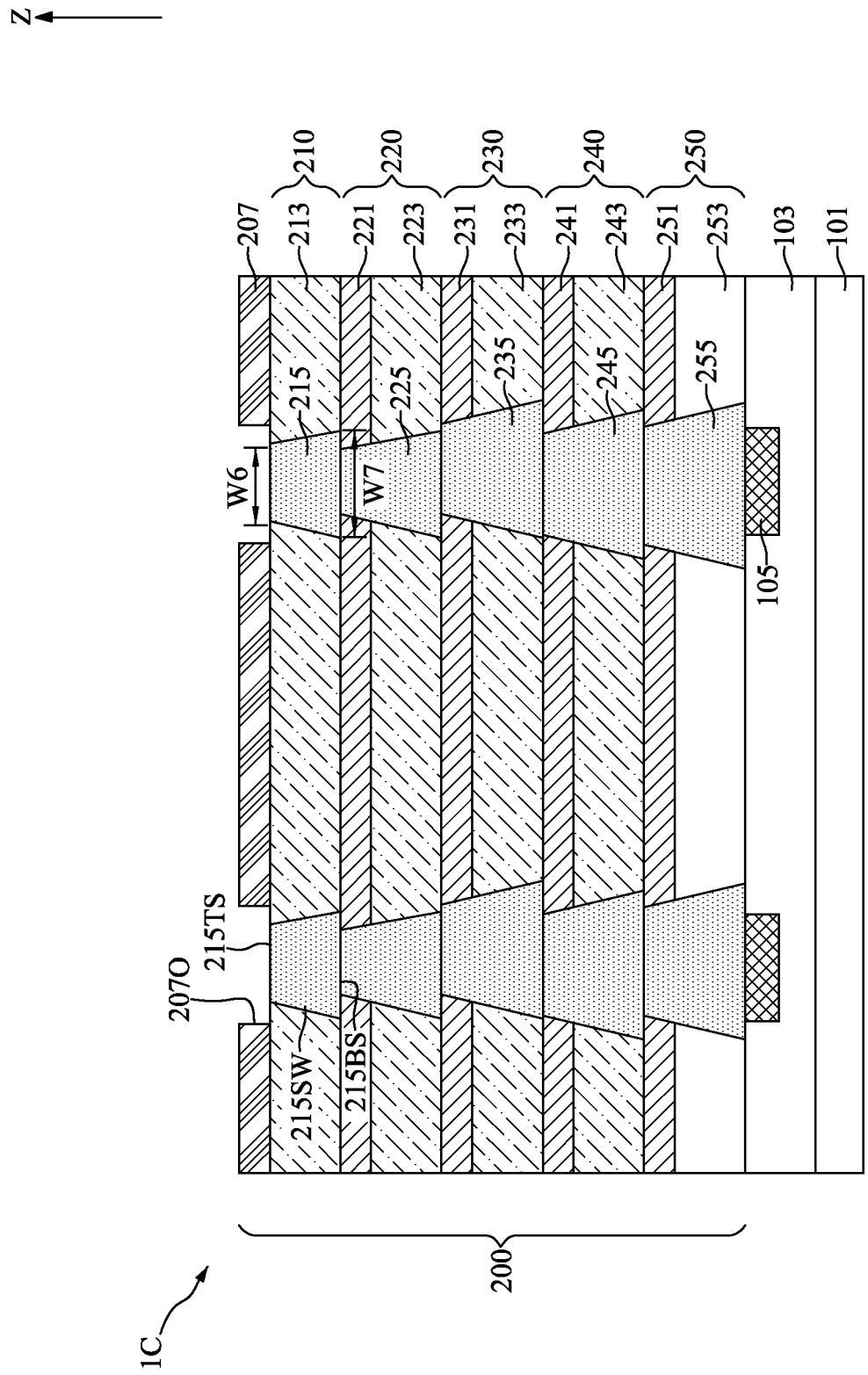
Figure 5:
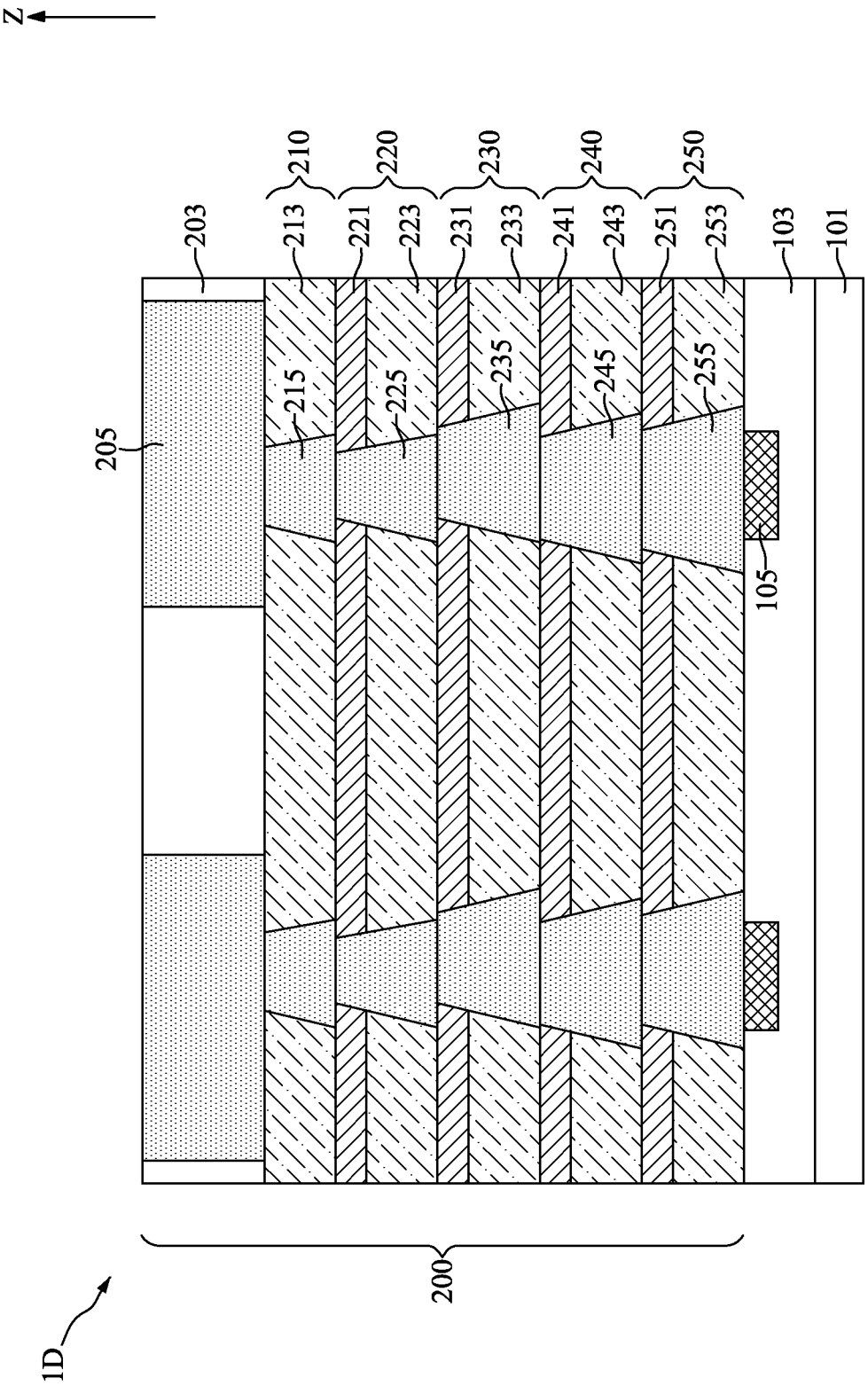

FIG. 1 illustrates, in a schematic cross-sectional view diagram, a semiconductor device 1A in accordance with one embodiment of the present disclosure. FIG. 2 illustrates, in a schematic close-up cross-sectional view diagram, a first via 215 of the semiconductor device 1A in accordance with one embodiment of the present disclosure. FIGS. 3 to 5 illustrate, in schematic cross-sectional view diagrams, semiconductor devices 1B, 1C, and 1D in accordance with some embodiments of the present disclosure.

With reference to FIG. 1, the semiconductor device 1 may include a substrate 101, a plurality of device elements (not show for clarity), an inter-dielectric layer 103, a plurality of conductive features, and a multi-stacking carrier structure 200.

With reference to FIG. 1, the substrate 101 may include a bulk semiconductor substrate that is composed entirely of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the thickness T0 of the substrate 101 may be less than about 200 μm, less than about 50 μm, or less than about 10 μm. For example, the thickness T0 of the substrate 101 may be about 3 μm.

With reference to FIG. 1, the plurality of device elements may be formed on the bulk semiconductor substrate. Some portions of the plurality of device elements may be formed in the bulk semiconductor substrate. The plurality of device elements may be transistors such as complementary metal-oxide-semiconductor transistors, metal-oxide-semiconductor field-effect transistors, fin field-effect-transistors, the like, or a combination thereof.

With reference to FIG. 1, the inter-dielectric layer 103 may be disposed on the substrate 101. In some embodiments, the inter-dielectric layer 103 may be a stacked layer structure. The inter-dielectric layer 103 may include a plurality of insulating sub-layers. Each of the plurality of insulating sub-layers may have a thickness between about 0.5 micrometer and about 3.0 micrometer. The plurality of insulating sub-layers may be formed of, for example, silicon oxide, borophosphosilicate glass, undoped silicate glass, fluorinated silicate glass, low-k dielectric materials, the like, or a combination thereof. The plurality of insulating sub-layers may be formed of different materials but is not limited thereto. The low-k dielectric materials may have a dielectric constant less than 3.0 or even less than 2.5. In some embodiments, the low-k dielectric materials may have a dielectric constant less than 2.0. The plurality of insulating sub-layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 1, the plurality of conductive features may be disposed in the inter-dielectric layer 103. The plurality of conductive features may include interconnect layers (not shown for clarity), conductive vias (not shown for clarity), and a plurality of conductive pads 105. The interconnect layers may be separated from each other and may be horizontally disposed in the plurality of dielectric layers along the direction Z. In the present embodiment, the topmost interconnect layers may be designated as the conductive pads 105. The top surfaces of the conductive pads 105 and the top surface of the inter-dielectric layer 103 may be substantially coplanar. The conductive vias may connect adjacent interconnect layers along the direction Z, adjacent device element and interconnect layer, and adjacent conductive pad 105 and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units of the semiconductor device 1A. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 1, the multi-stacking carrier structure 200 may be disposed on the inter-dielectric layer 103. The multi-stacking carrier structure 200 may include a first tier 210, a second tier 220, a third tier 230, a fourth tier 240, a fifth tier 250, and a top passivation layer 203. In some embodiments, the thickness TL of the multi-stacking carrier structure 200 may be greater than about 500 micrometers. In some embodiments, the thickness ratio of the thickness TL of the multi-stacking carrier structure 200 to the thickness T0 of the substrate 101 may be between about 180:1 and about 50:1.

With reference to FIG. 1, the first tier 210 may be disposed on the inter-dielectric layer 103. The first tier 210 may include a first passivation layer 211, a first insulating layer 213, and a plurality of first vias 215.

With reference to FIG. 1, the first passivation layer 211 may be disposed on the inter-dielectric layer 103. In some embodiments, the first passivation layer 211 may be formed of, for example, an oxide material. In some embodiments, the first passivation layer 211 may be formed of, example, silicon oxide, borophosphosilicate glass, undoped silicate glass, fluorinated silicate glass, the like, or a combination thereof. In some embodiments, the thickness T1 of the first passivation layer 211 may be between about 1 μm and about 2 μm.

With reference to FIG. 1, the first insulating layer 213 may be disposed on the first passivation layer 211. In some embodiments, the first insulating layer 213 may be formed of, for example, an oxide material. In some embodiments, the first insulating layer 213 may be formed of the same material as the first passivation layer 211. In some embodiments, the first insulating layer 213 may be formed of, example, silicon oxide, borophosphosilicate glass, undoped silicate glass, fluorinated silicate glass, the like, or a combination thereof. In some embodiments, the thickness T2 of the first insulating layer 213 may be less than about 200 μm. For example, the thickness T2 of the first insulating layer 213 may be between about 150 μm and about 190 μm.

With reference to FIGS. 1 and 2, in some embodiments, the plurality of first vias 215 may be disposed along the first insulating layer 213 and the first passivation layer 211, disposed on the plurality of conductive pads 105, and electrically connected to the plurality of conductive pads 105, respectively and correspondingly.

For brevity, clarity, and convenience of description, only one first via 215 is described.

In some embodiments, the sidewall 215SW of the first via 215 may be tapered. The width W0 of the bottom surface 215BS of the first via 215 may be less than the width W1 of the top surface 215TS of the first via 215. In some embodiments, the first via 215 may include a filler layer FL, a seed layer SL, an adhesion layer AL, a barrier layer BL, and an isolation layer IL.

It should be noted that, in the description of the present disclosure, a surface of an element (or a feature) located at the highest vertical level along the dimension Z is referred to as a top surface of the element (or the feature). A surface of an element (or a feature) located at the lowest vertical level along the dimension Z is referred to as a bottom surface of the element (or the feature).

It should be noted that, in the description of the present disclosure, a "width" refers to a size of an element (e.g., a layer, plug, trench, hole, opening, etc.) in a cross-sectional perspective measured from a side surface to an opposite surface of the element. The term "thickness" may substitute for "width" where indicated.

The filler layer FL may be disposed along the first insulating layer 213 and the first passivation layer 211, and disposed on the conductive pad 105. In some embodiments, the filler layer FL may have an aspect ratio between about 1:2 and about 1:35 or between about 1:10 and about 1:25. The filler layer FL may be formed of, for example, doped polysilicon, tungsten, copper, carbon nanotube, or solder alloy.

With reference to FIG. 2, in some embodiments, the seed layer SL may have a U-shaped cross-sectional profile. The seed layer SL may be disposed between the filler layer FL and the first insulating layer 213, between the filler layer FL and the first passivation layer 211, and between the filler layer FL and the conductive pad 105. In some embodiments, the seed layer SL may have a thickness between about 10 nm and about 40 nm. In some embodiments, the seed layer SL may be formed of, for example, copper. The seed layer SL may reduce a resistivity of an opening during the formation of the filler layer FL.

In some embodiments, the adhesion layer AL may have a U-shaped cross-sectional profile. The adhesion layer AL may be disposed between the seed layer SL and the first insulating layer 213, between the seed layer SL and the first passivation layer 211, and between the seed layer SL and the conductive pad 105. The seed layer SL may be formed of, for example, titanium, tantalum, titanium tungsten, or manganese nitride. The seed layer SL may improve an adhesion between the seed layer SL and the barrier layer BL.

In some embodiments, the barrier layer BL may have a U-shaped cross-sectional profile. The barrier layer BL may be between the adhesion layer AL and the first insulating layer 213, between the adhesion layer AL and the first passivation layer 211, and between the adhesion layer AL and the conductive pad 105. The barrier layer BL may be formed of, for example, tantalum, tantalum nitride, titanium, titanium nitride, rhenium, nickel boride, or tantalum nitride/tantalum bilayer. The barrier layer BL may inhibit diffusion of the conductive materials of the filler layer FL into the first insulating layer 213, the first passivation layer 211, or the inter-dielectric layer 103.

In some embodiments, the isolation layer IL may be disposed between the barrier layer BL and the first insulating layer 213, and between the barrier layer BL and the first passivation layer 211. In some embodiments, the isolation layer IL may be formed of, for example, silicon oxide, silicon nitride, silicon oxynitride, or tetra-ethyl ortho-silicate. The isolation layer IL may have a thickness between about 50 nm and about 200 nm. In some embodiments, the isolation layer IL may be formed of, for example, parylene, epoxy, or polyp-xylene). The isolation layer IL may have a thickness between about 1 μm and about 5 μm. The isolation layer IL may ensure the filler layer FL is electrically isolated in the first insulating layer 213 and the first passivation layer 211.

With reference to FIG. 1, the second tier 220 may be disposed on the first tier 210. The second tier 220 may include a second passivation layer 221, a second insulating layer 223, and a plurality of second vias 225. The second passivation layer 221 may be disposed on the first insulating layer 213. The second insulating layer 223 may be disposed on the second passivation layer 221. The plurality of second vias 225 may be disposed along the second insulating layer 223 and the second passivation layer 221, disposed on the plurality of first vias 215, and electrically connected to the plurality of first vias 215, respectively and correspondingly. The second passivation layer 221, the second insulating layer 223, and the plurality of second vias 225 may be formed of the same materials as the first passivation layer 211, the first insulating layer 213, and the plurality of first vias 215, respectively and correspondingly, and descriptions thereof are not repeated herein.

With reference to FIG. 1, the width W2 of the top surface 225TS of the second via 225 may be greater than the width W1 of the top surface 215TS of the first via 215.

With reference to FIG. 1, the third tier 230 may be disposed on the second tier 220. The third tier 230 may include a third passivation layer 231, a third insulating layer 233, and a plurality of third vias 235. The third passivation layer 231 may be disposed on the second insulating layer 223. The third insulating layer 233 may be disposed on the third passivation layer 231. The plurality of third vias 235 may be disposed along the third insulating layer 233 and the third passivation layer 231, disposed on the plurality of second vias 225, and electrically connected to the plurality of second vias 225, respectively and correspondingly. The third passivation layer 231, the third insulating layer 233, and the plurality of third vias 235 may be formed of the same materials as the first passivation layer 211, the first insulating layer 213, and the plurality of first vias 215, respectively and correspondingly, and descriptions thereof are not repeated herein.

With reference to FIG. 1, the width W3 of the top surface 235TS of the third via 235 may be greater than the width W2 of the top surface 225TS of the second via 225.

With reference to FIG. 1, the fourth tier 240 may be disposed on the third tier 230. The fourth tier 240 may include a fourth passivation layer 241, a fourth insulating layer 243, and a plurality of fourth vias 245. The fourth passivation layer 241 may be disposed on the third insulating layer 233. The fourth insulating layer 243 may be disposed on the fourth passivation layer 241. The plurality of fourth vias 245 may be disposed along the fourth insulating layer 243 and the fourth passivation layer 241, disposed on the plurality of third vias 235, and electrically connected to the plurality of third vias 235, respectively and correspondingly. The fourth passivation layer 241, the fourth insulating layer 243, and the plurality of fourth vias 245 may be formed of the same materials as the first passivation layer 211, the first insulating layer 213, and the plurality of first vias 215, respectively and correspondingly, and descriptions thereof are not repeated herein.

With reference to FIG. 1, the width W4 of the top surface 245TS of the fourth via 245 may be greater than the width W3 of the top surface 235TS of the third via 235.

With reference to FIG. 1, the fifth tier 250 may be disposed on the fourth tier 240. The fifth tier 250 may include a fifth passivation layer 251, a fifth insulating layer 253, and a plurality of fifth vias 255. The fifth passivation layer 251 may be disposed on the fourth insulating layer 243. The fifth insulating layer 253 may be disposed on the fifth passivation layer 251. The plurality of fifth vias 255 may be disposed along the fifth insulating layer 253 and the fifth passivation layer 251, disposed on the plurality of fourth vias 245, and electrically connected to the plurality of fourth vias 245, respectively and correspondingly. The fifth passivation layer 251, the fifth insulating layer 253, and the plurality of fifth vias 255 may be formed of the same materials as the first passivation layer 211, the first insulating layer 213, and the plurality of first vias 215, respectively and correspondingly, and descriptions thereof are not repeated herein.

With reference to FIG. 1, the width W5 of the top surface 255TS of the fifth via 255 may be greater than the width W4 of the top surface 245TS of the fourth via 245.

It should be noted that, in the description of present disclosure, the number of the tiers of the multi-stacking carrier structure 200 is for illustration purpose only. In other words, the number of the tiers of the multi-stacking carrier structure 200 may be greater than or less than five.

With reference to FIG. 1, the top passivation layer 203 may be disposed on the topmost insulating layer (i.e., the fifth insulating layer 253 of the fifth tier 250). The top passivation layer 203 may be a single layer structure or a multi-layer structure. In some embodiments, the top passivation layer 203 may include polybenzoxazole, polyimide, benzocyclobutene, ajinomoto buildup film, solder resist film, or the like, or a combination thereof. In some other embodiments, the top passivation layer 203 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIG. 1, a plurality of first top openings 203O may be disposed along the top passivation layer 203 to expose the plurality of fifth vias 255, respectively and correspondingly. The exposed fifth vias 255 may be electrically coupled to probes for electrical characterization tests.

The multi-stacking carrier structure 200 may serve as a temporary carrier during a thinning process of the substrate 101. With the assistance of the multi-stacking carrier structure 200, the performance of the semiconductor device 1A including the substrate 101 less than 10 μm can be analyzed. In contrast, a conventional semiconductor device including a substrate less than 10 μm is covered by a carrier so that the performance thereof may not be analyzed easily.

With reference to FIG. 3, the semiconductor device 1B may have a structure similar to that illustrated in FIG. 1. The same or similar elements in FIG. 3 as in FIG. 1 have been marked with similar reference numbers and duplicative descriptions have been omitted.

With reference to FIG. 3, a plurality of redistribution layers 205 may be disposed along the top passivation layer 203, disposed on the plurality of fifth vias 255, and electrically connected to the plurality of fifth vias 255, respectively and correspondingly. The plurality of redistribution layers 205 may re-route the plurality of fifth vias 255 to provide more flexible configuration and more contacting area for electrical characterization tests. The plurality of redistribution layers 205 may be formed of, for example, tungsten, titanium, tin, nickel, copper, gold, aluminum, platinum, cobalt, or a combination thereof.

With reference to FIG. 4, the semiconductor device 1C may have a structure similar to that illustrated in FIG. 1. The same or similar elements in FIG. 4 as in FIG. 1 have been marked with similar reference numbers and duplicative descriptions have been omitted.

With reference to FIG. 4, the fifth tier 250, the fourth tier 240, the third tier 230, the second tier 220, and the first tier 210 may be disposed on the inter-dielectric layer 103 in a reversed order with respective to the multi-stacking carrier structure 200 illustrated in FIG. 1. For example, the fifth insulating layer 253 is disposed on the inter-dielectric layer 103, the fifth passivation layer 251 is disposed on the fifth insulating layer 253, the fourth insulating layer 243 is disposed on the fifth passivation layer 251, and the fourth passivation layer 241 is disposed on the fourth insulating layer 243.

With reference to FIG. 4, in some embodiments, the sidewall 215SW of the first via 215 may be tapered. The width W7 of the bottom surface 215BS of the first via 215 may be greater than the width W6 of the top surface 215TS of the first via 215.

With reference to FIG. 4, in some embodiments, an etch stop layer 207 may be disposed on the first insulating layer 213 of the first tier 210. In some embodiments, the etch stop layer 207 may be preferably formed of a dielectric material having a different etch selectivity from adjacent layers. For example, the etch stop layer 207 may be formed of silicon nitride, silicon carbonitride, silicon oxycarbide, the like, or a combination thereof. A plurality of second top openings 207O may be disposed along the etch stop layer 207 to expose the plurality of first vias 215. The exposed first vias 215 may be electrically coupled to probes for electrical characterization tests.

With reference to FIG. 5, the semiconductor device 1D may have a structure similar to that illustrated in FIG. 4. The same or similar elements in FIG. 5 as in FIG. 4 have been marked with similar reference numbers and duplicative descriptions have been omitted.

With reference to FIG. 5, the top passivation layer 203 may be disposed on the first insulating layer 213 of the first tier 210. The top passivation layer 203 may be a single layer structure or a multi-layer structure. In some embodiments, the top passivation layer 203 may include polybenzoxazole, polyimide, benzocyclobutene, ajinomoto buildup film, solder resist film, or the like, or a combination thereof. In some other embodiments, the top passivation layer 203 may be a dielectric layer. The dielectric layer may include a nitride such as silicon nitride, an oxide such as silicon oxide, an oxynitride such as silicon oxynitride, silicon nitride oxide, phosphosilicate glass, borosilicate glass, boron-doped phosphosilicate glass, the like, or a combination thereof.

With reference to FIG. 5, the plurality of redistribution layers 205 may be disposed along the top passivation layer 203, disposed on the plurality of first vias 215, and electrically connected to the plurality of first vias 215, respectively and correspondingly. The plurality of redistribution layers 205 may re-route the plurality of first vias 215 to provide more flexible configuration and more contacting area for electrical characterization tests. The plurality of redistribution layers 205 may be formed of, for example, tungsten, titanium, tin, nickel, copper, gold, aluminum, platinum, cobalt, or a combination thereof.

It should be noted that, in the description of the present disclosure, the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

Figure 6:
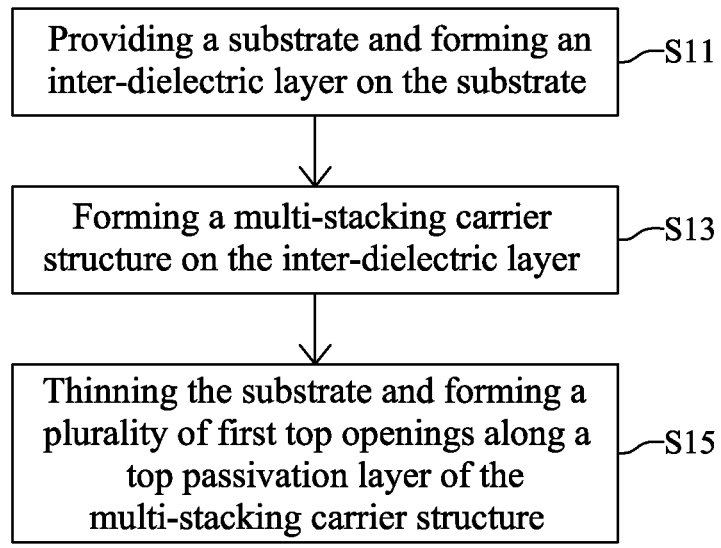
FIG. 6 illustrates, in a flowchart diagram form, a method for fabricating a semiconductor device in accordance with one embodiment of the present disclosure.

FIG. 6 illustrates, in a flowchart diagram form, a method 10 for fabricating a semiconductor device 1A in accordance with one embodiment of the present disclosure. FIGS. 7 to 21 illustrate, in schematic cross-sectional view diagrams, a flow for fabricating the semiconductor device 1A in accordance with one embodiment of the present disclosure.

Figure 7:
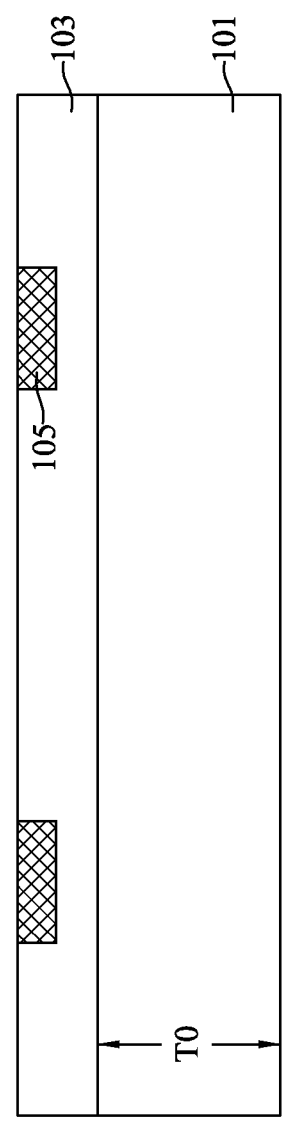
FIGS. 7 to 21 illustrate, in schematic cross-sectional view diagrams, a flow for fabricating the semiconductor device in accordance with one embodiment of the present disclosure.

With reference to FIGS. 6 and 7, at step S11, the substrate 101 may be provided and the inter-dielectric layer 103 may be formed on the substrate 101.

With reference to FIG. 7, the material of the substrate 101 is illustrated in FIG. 1, and descriptions thereof are not repeated herein. In some embodiments, the substrate 101 may include a semiconductor-on-insulator structure which consisting of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm. It should be noted that, in the current stage, the thickness T0 of the substrate 101 may be greater than 700 μm or greater than 500 μm.

With reference to FIG. 7, the inter-dielectric layer 103 may be formed on the substrate 101 by deposition processes such as chemical vapor deposition. Planarization processes, such as chemical mechanical polishing, may be performed to provide a substantially flat surface for subsequent processing steps. The device elements (not shown for clarity) and the conductive features (not shown for clarity) may be formed during the formation of the inter-dielectric layer 103. The plurality of conductive pads 105 may be formed in the inter-dielectric layer 103 by, for example, a damascene process. The top surfaces of the plurality of conductive pads 105 and the top surface of the inter-dielectric layer 103 may be substantially coplanar.

With reference to FIG. 6 and FIGS. 8 to 19, at step S13, the multi-stacking carrier structure 200 may be formed on the inter-dielectric layer 103.

Figure 8:
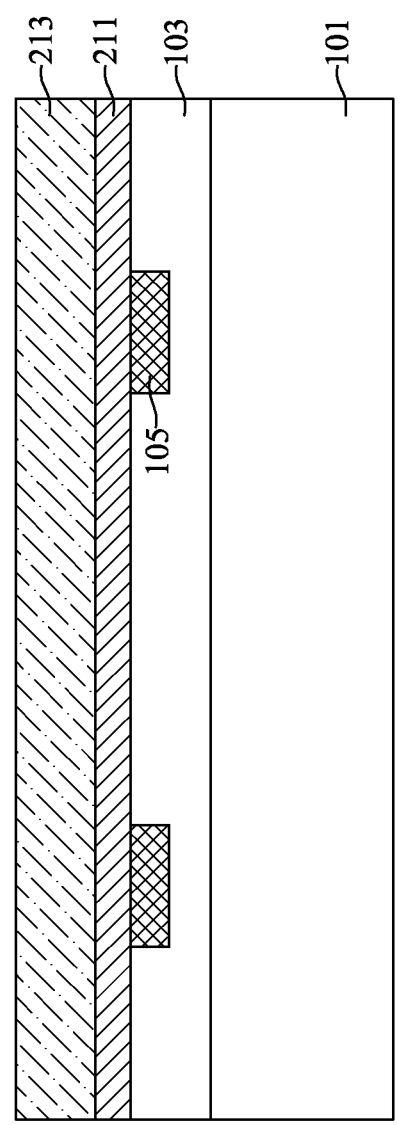

With reference to FIG. 8, the first passivation layer 211 may be formed on the inter-dielectric layer 103 and the third passivation layer 231 may be formed by, for example chemical vapor deposition, plasma enhanced chemical vapor deposition, or other applicable deposition process. In some embodiments, an oxide bonding process may be performed to form the first insulating layer 213 on the first passivation layer 211. The material of the first passivation layer 211 is illustrated in FIG. 1, and descriptions thereof are not repeated herein.

Figure 9:
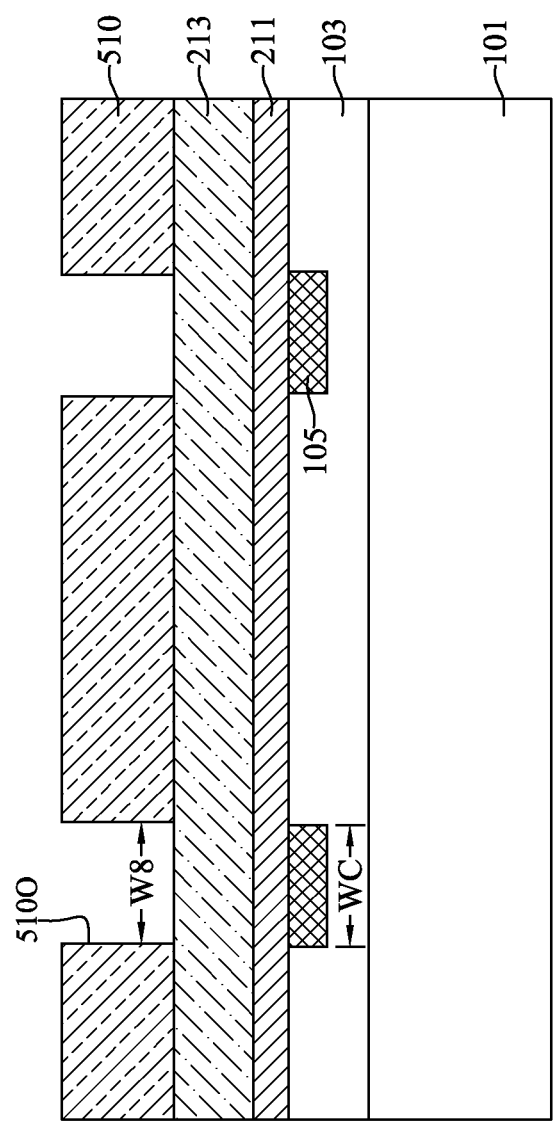

With reference to FIG. 9, a first mask layer 510 may be formed on the first insulating layer 213. The first mask layer 510 may include a plurality of first pattern openings 510O which defines the positions of the plurality of first vias 215. The first pattern openings 510O may have a width W8. The width W8 of the first pattern opening 510O may be greater than the width WC of the conductive pad 105.

Figure 10:
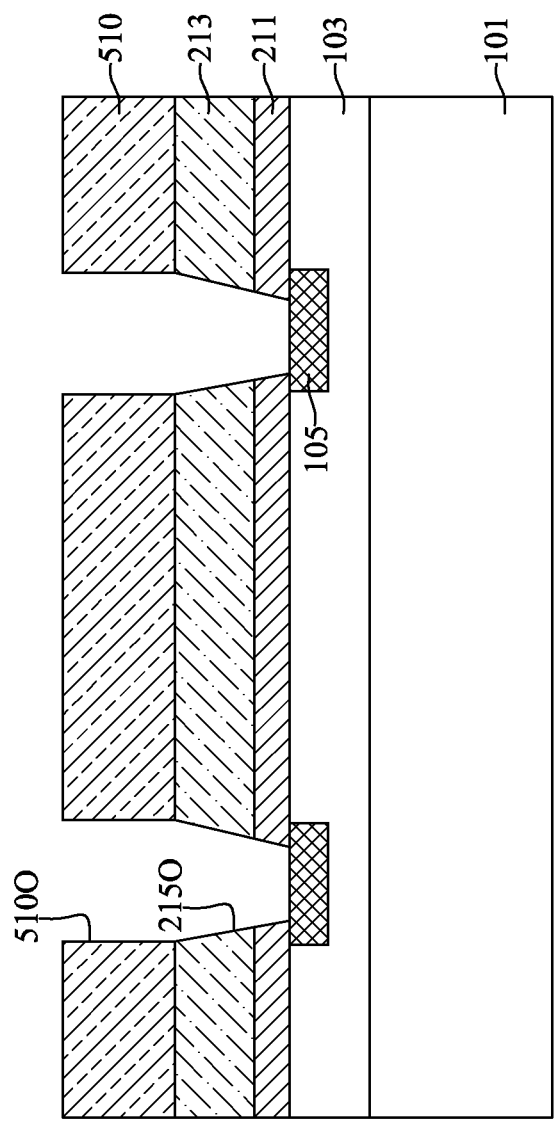

With reference to FIG. 10, an oxide etch process may be performed using the first mask layer 510 as the pattern guide to remove portions of the first insulating layer 213 and portions of the first passivation layer 211, and concurrently form a plurality of first via openings 215O. In some embodiments, the sidewalls of the plurality of first via openings 215O may be tapered. After the oxide etch process, the first mask layer 510 may be removed.

Figure 11:
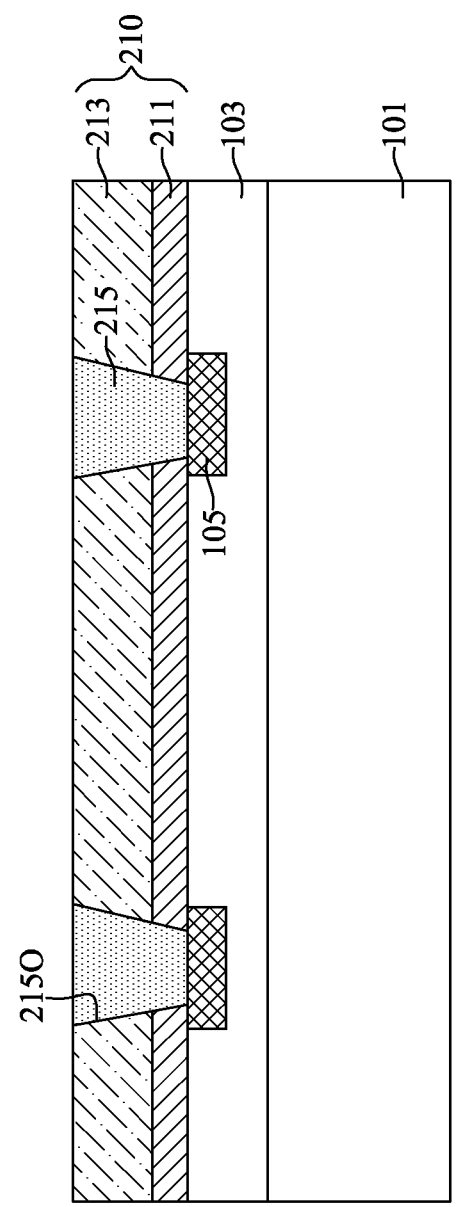

With reference to FIG. 11, the plurality of first vias 215 may be formed in the plurality of first via openings 215O by, for example, chemical vapor deposition, physical vapor deposition, evaporation, sputtering, electroplating, or a combination thereof. A planarization process, such as chemical mechanical polishing, may be performed to remove excess material and provide a substantially flat surface for subsequent processing steps. The material and the structure of the plurality of first vias 215 are illustrated in the FIGS. 1 and 2, and descriptions thereof are not repeated herein. The first passivation layer 211, the first insulating layer 213, and the plurality of first vias 215 together configure the first tier 210.

Figure 12:
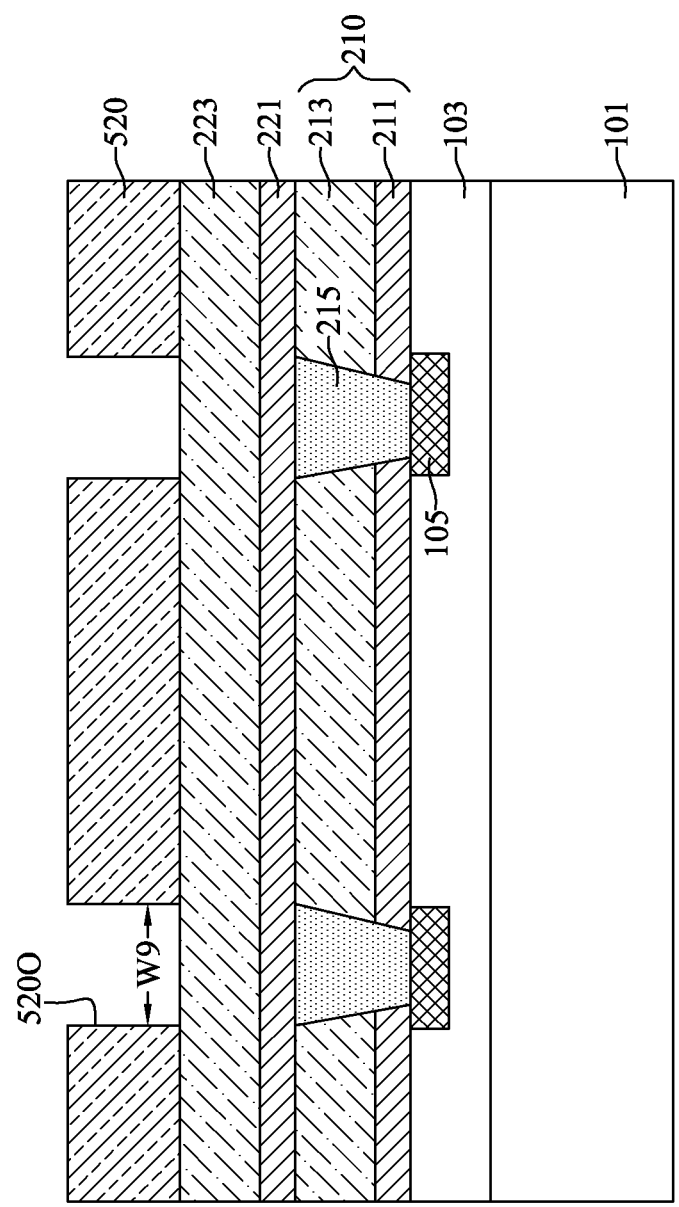

With reference to FIG. 12, the second passivation layer 221 may be formed on the first insulating layer 213, the second insulating layer 223 may be formed on the second passivation layer 221, and a second mask layer 520 may be formed on the second insulating layer 223. The material of the second passivation layer 221 and the material the second insulating layer 223 are illustrated in FIG. 1, and descriptions thereof are not repeated herein. The second passivation layer 221, the second insulating layer 223, and the second mask layer 520 may be formed with a procedure similar to the first tier 210 illustrating in FIGS. 8 to 11, and descriptions thereof are not repeated herein. The second mask layer 520 may include a plurality of second pattern openings 520O which defines the positions of the plurality of second vias 225. The second pattern opening 520O may have a width W9 greater than the width W8 of the first pattern opening 510O.

Figure 13:
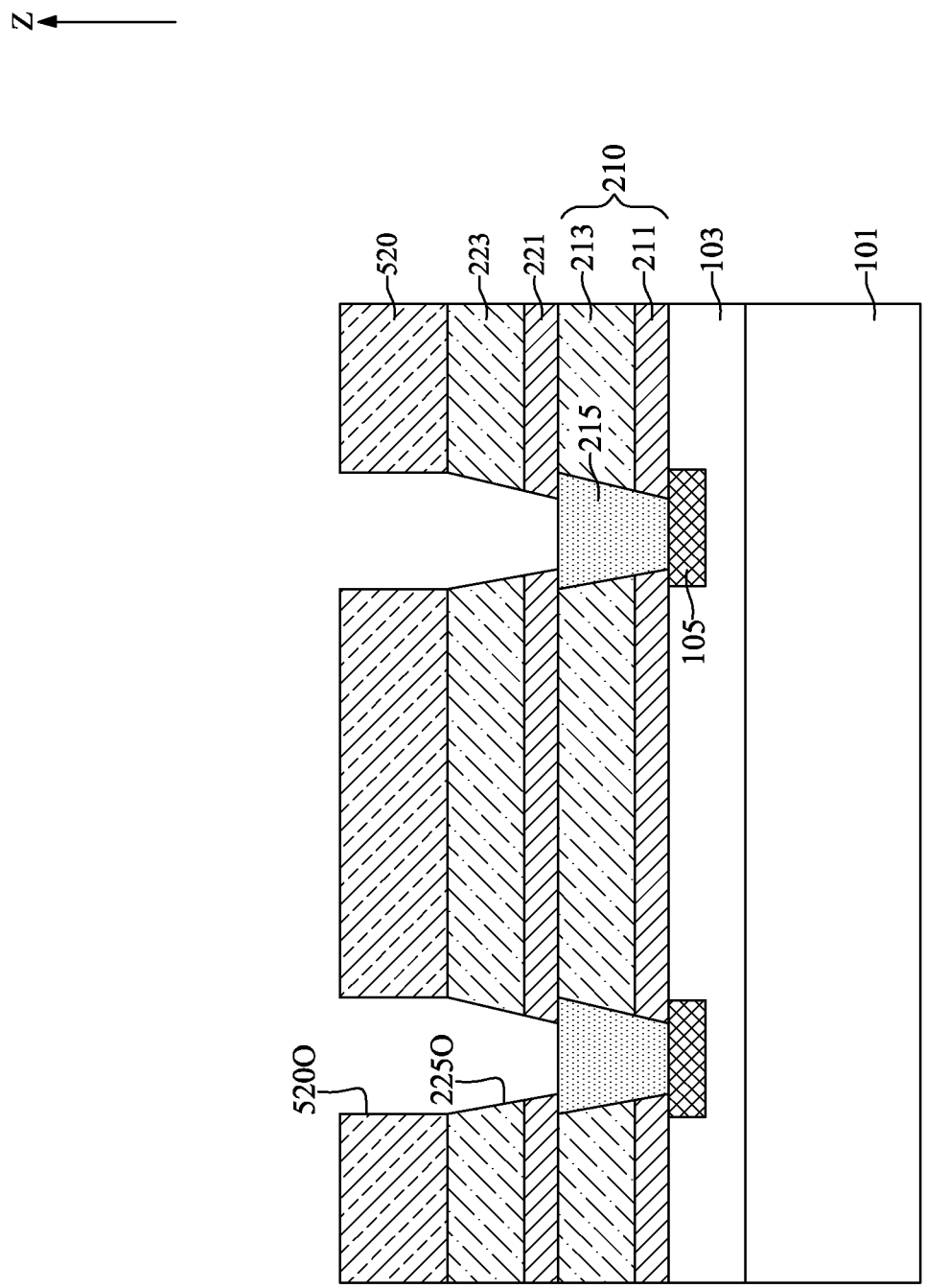

With reference to FIG. 13, an oxide etch process may be performed using the second mask layer 520 as the pattern guide to remove portions of the second insulating layer 223 and portions of the second passivation layer 221, and concurrently form a plurality of second via openings 225O. In some embodiments, the sidewalls of the plurality of second via openings 225O may be tapered. After the oxide etch process, the second mask layer 520 may be removed.

Figure 14:
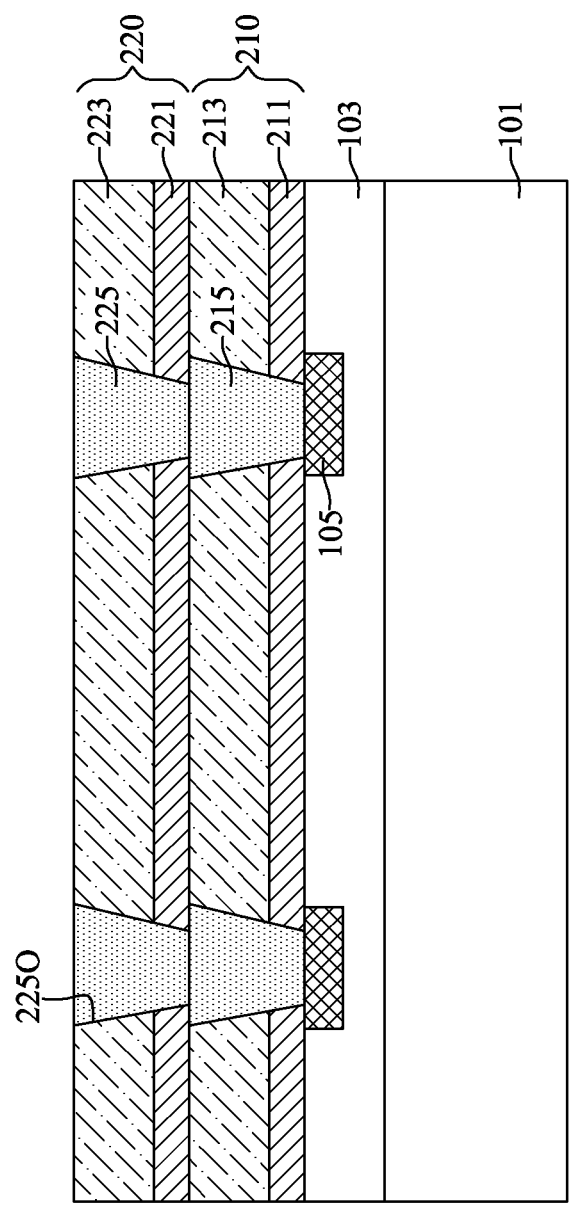

With reference to FIG. 14, the plurality of second vias 225 may be formed in the plurality of second via openings 225O with a procedure similar to the plurality of first vias 215, and descriptions thereof are not repeated herein. A planarization process, such as chemical mechanical polishing, may be performed to remove excess material and provide a substantially flat surface for subsequent processing steps. The second passivation layer 221, the second insulating layer 223, and the plurality of second vias 225 together configure the second tier 220.

The greater width of the second pattern opening 520O may be transferred to the second via opening 225O and then inherited by the second vias 225. The greater width of the second vias 225 may provide a larger tolerance window for subsequent photolithography process (e.g., photolithography process for the third via 235). As a result, the yield of the semiconductor device 1A may be improved.

Figure 15:
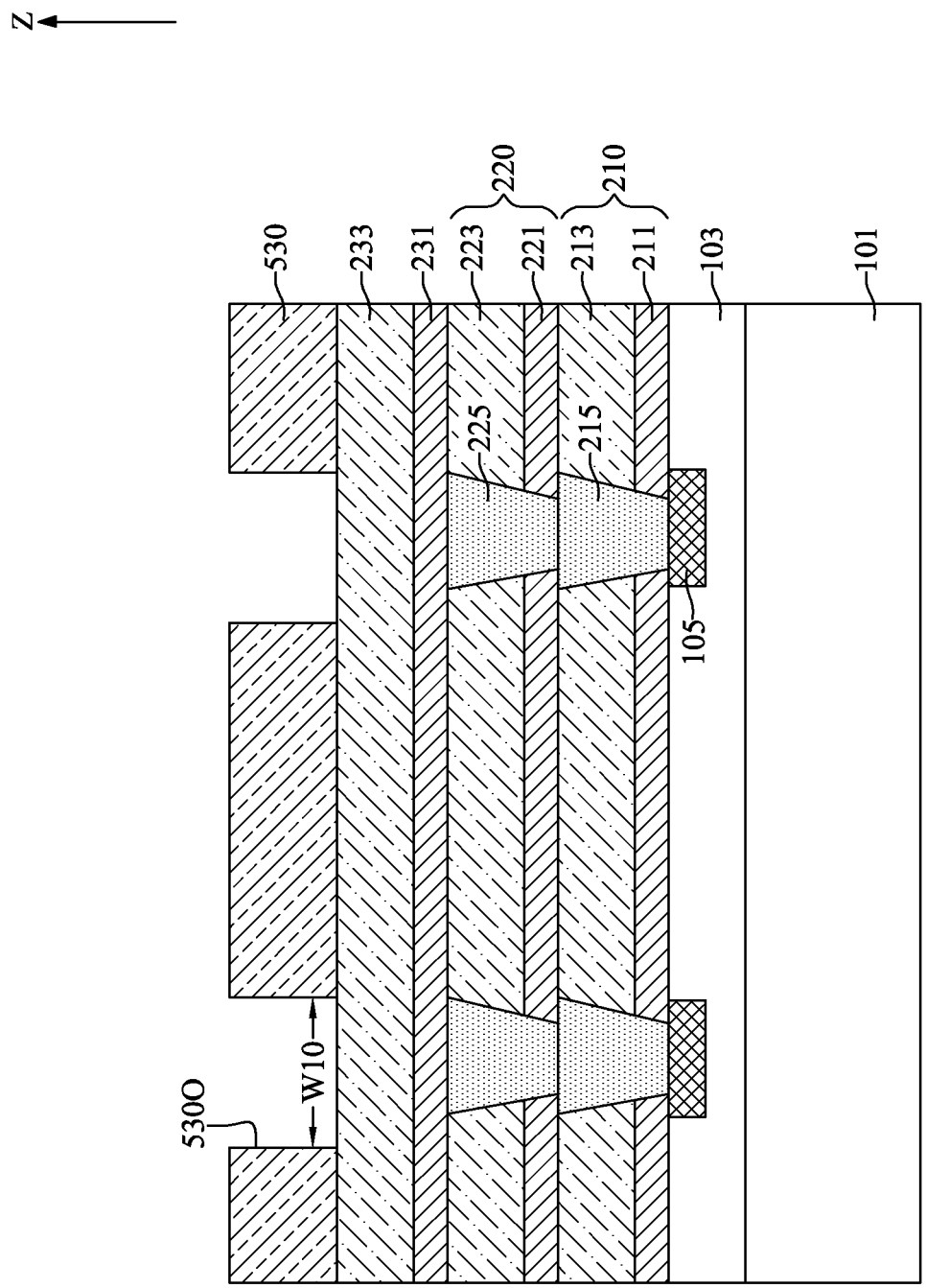

With reference to FIG. 15, the third passivation layer 231 may be formed on the second insulating layer 223, the third insulating layer 233 may be formed on the third passivation layer 231, and a third mask layer 530 may be formed on the third insulating layer 233. The material of the third passivation layer 231 and the material the third insulating layer 233 are illustrated in FIG. 1, and descriptions thereof are not repeated herein. The third passivation layer 231, the third insulating layer 233, and the third mask layer 530 may be formed with a procedure similar to the first tier 210 illustrating in FIGS. 8 to 11, and descriptions thereof are not repeated herein. The third mask layer 530 may include a plurality of third pattern openings 530O which defines the positions of the plurality of third vias 235. The third pattern opening 530O may have a width W10 greater than the width W9 of the second pattern opening 520O.

Figure 16:
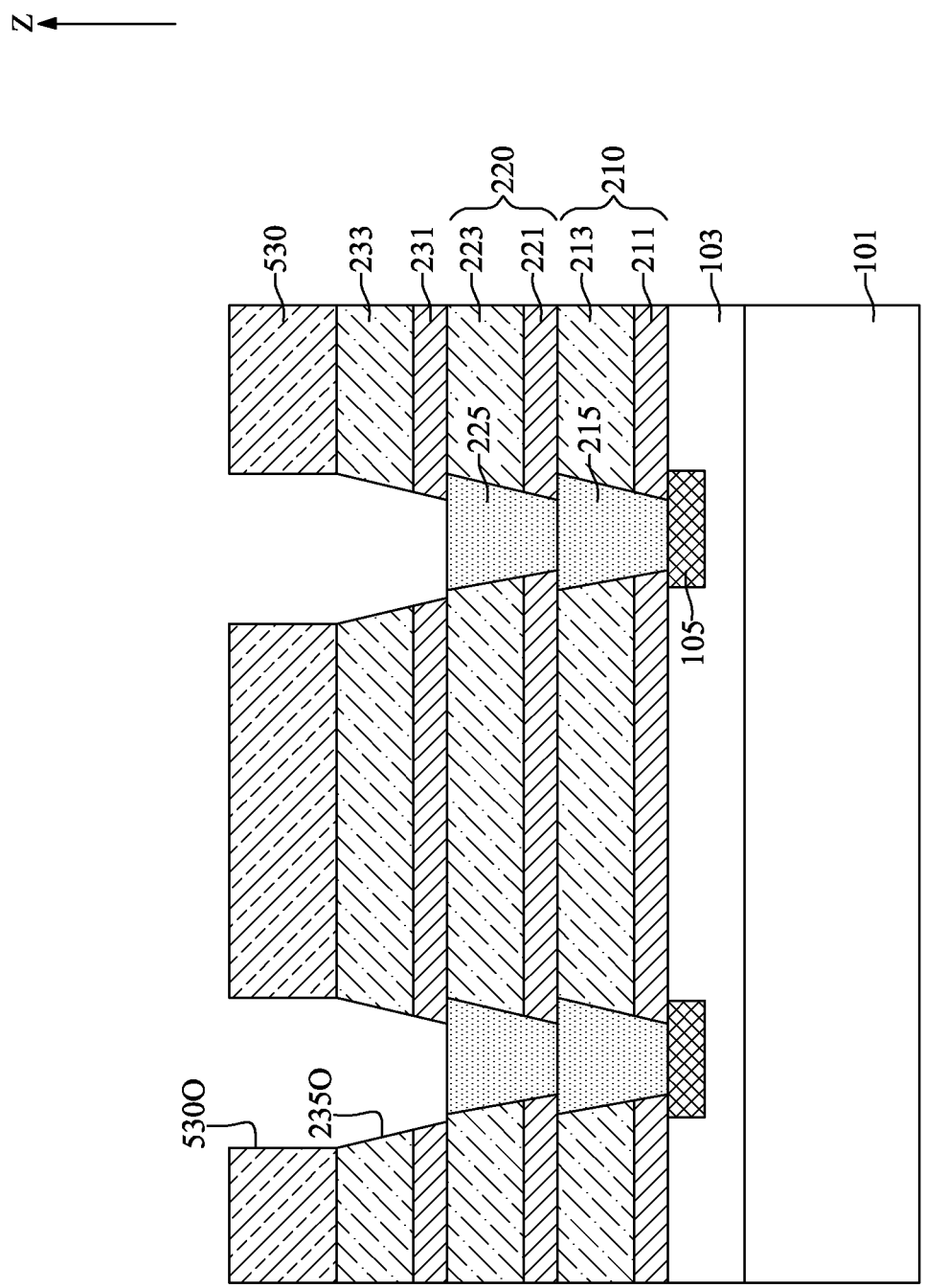

With reference to FIG. 16, an oxide etch process may be performed using the third mask layer 530 as the pattern guide to remove portions of the third insulating layer 233 and portions of the third passivation layer 231, and concurrently form a plurality of third via openings 235O. In some embodiments, the sidewalls of the plurality of third via openings 235O may be tapered. After the oxide etch process, the third mask layer 530 may be removed.

Figure 17:
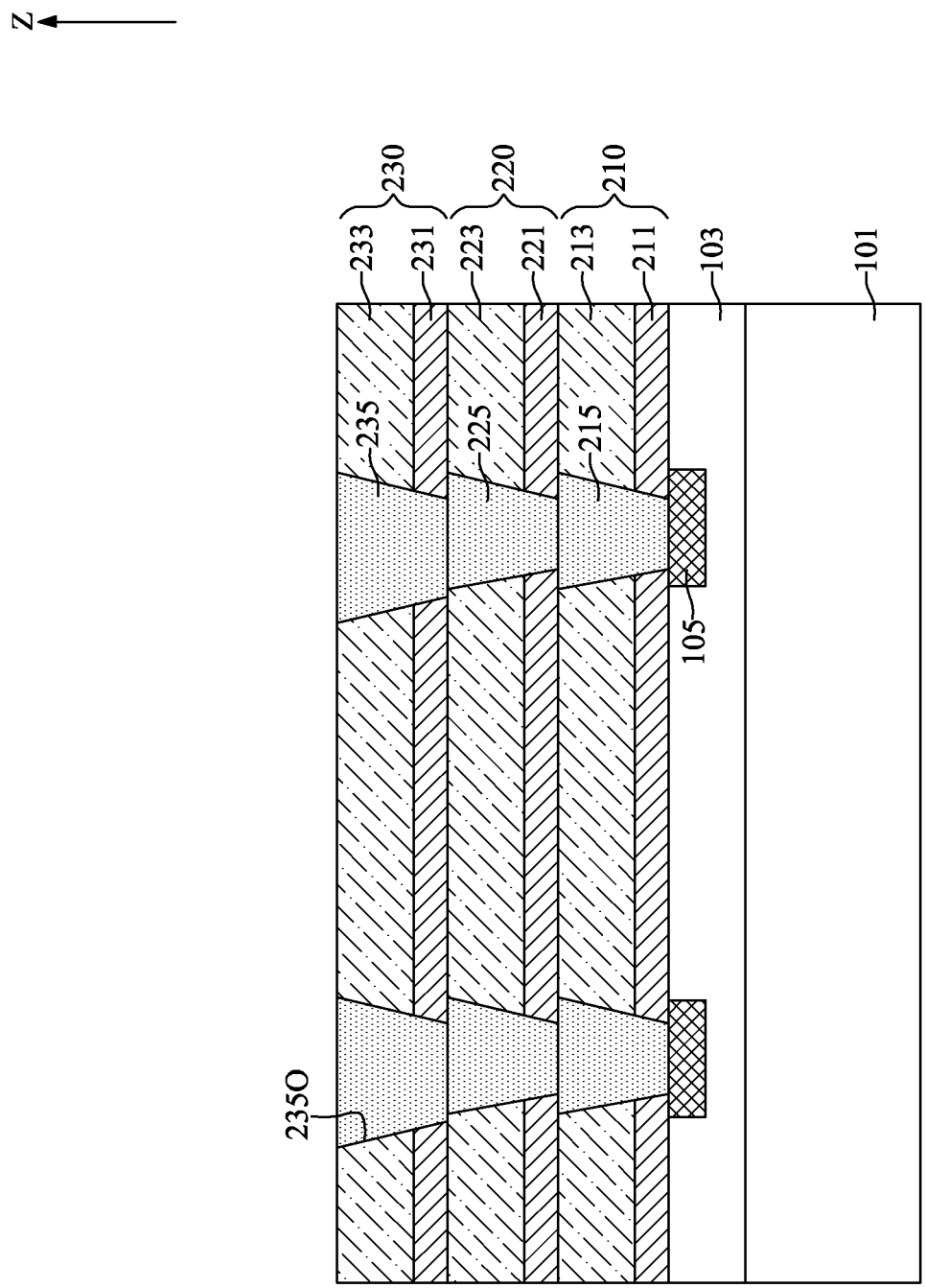

With reference to FIG. 17, the plurality of third vias 235 may be formed in the plurality of third via openings 235O with a procedure similar to the plurality of first vias 215, and descriptions thereof are not repeated herein. A planarization process, such as chemical mechanical polishing, may be performed to remove excess material and provide a substantially flat surface for subsequent processing steps. The third passivation layer 231, the third insulating layer 233, and the plurality of third vias 235 together configure the third tier 230.

It should be noted that the third via 235 seems deviated from the second via 225 along the direction Z to emphasis the benefit of larger tolerance window of a photolithography process gained be the wider width of the second via 225. That is, even the alignment of the photolithography process is shifted, the vias 225, 235 can still electrically connect properly.

Figure 18:
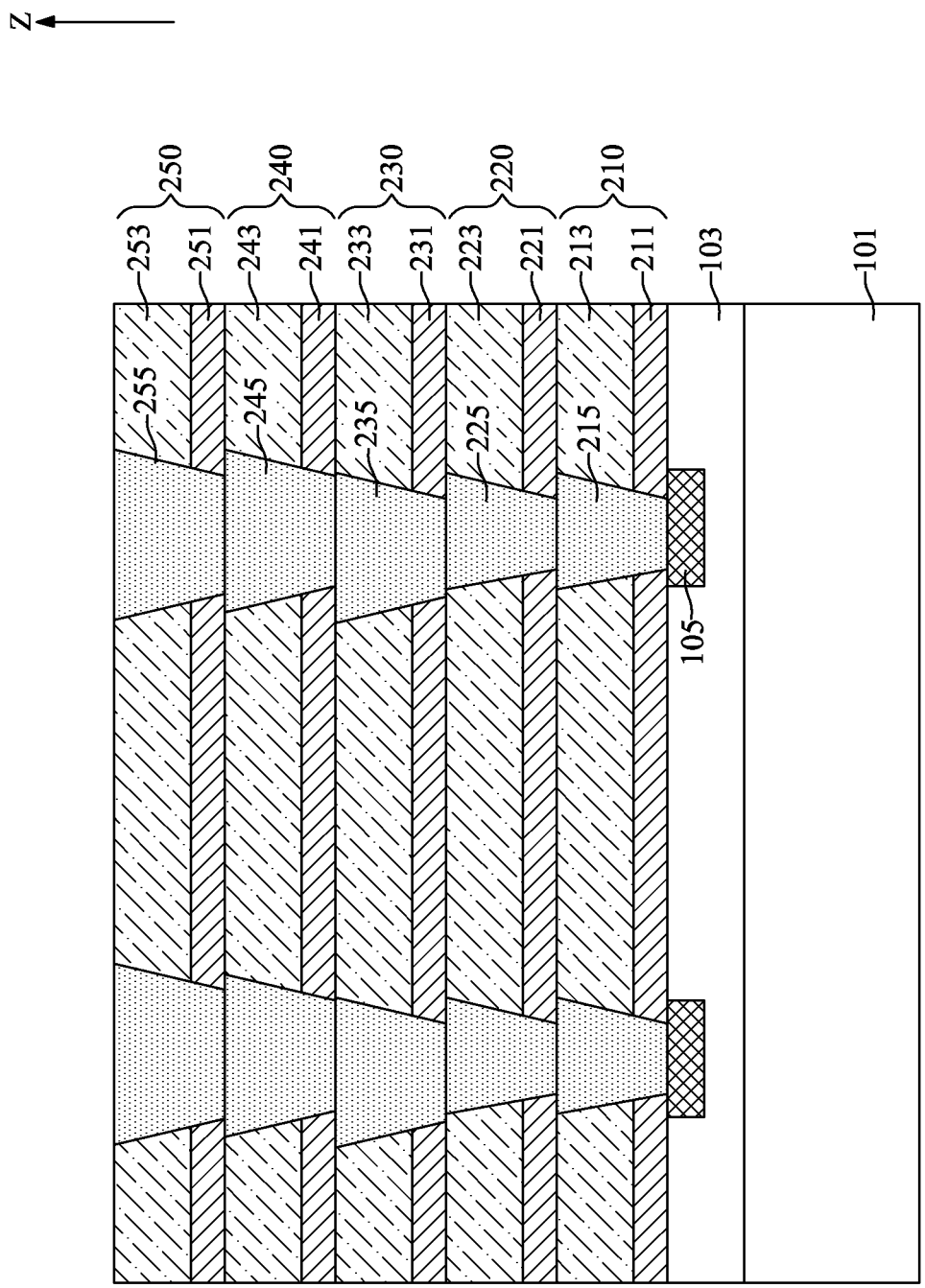

With reference to FIG. 18, the fourth tier 240 and the fifth tier 250 may be formed with a procedure similar to the first tier 210 illustrating in FIGS. 8 to 11, and descriptions thereof are not repeated herein.

Figure 19:
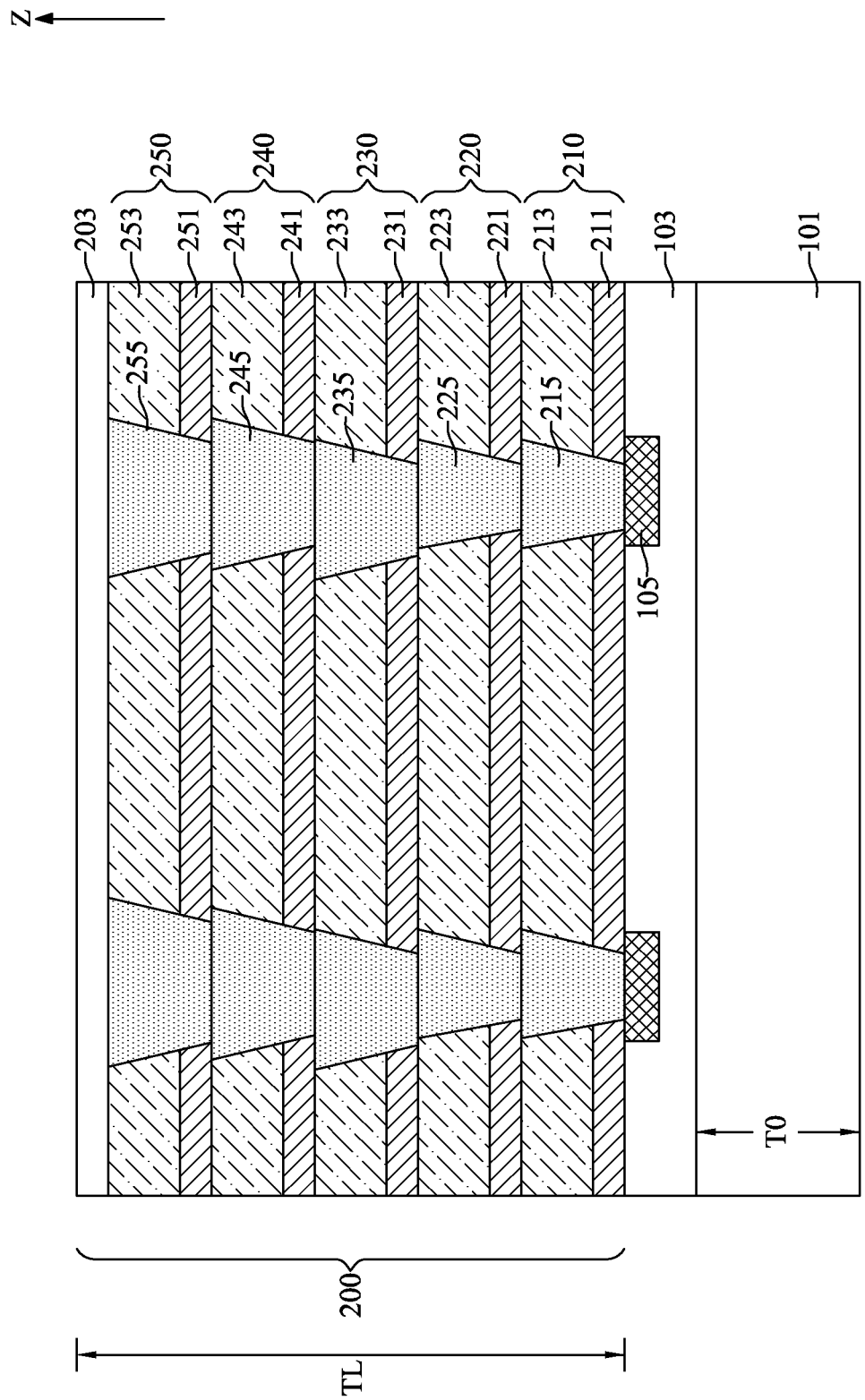

With reference to FIG. 19, the top passivation layer 203 may be formed on the fifth tier 250. The top passivation layer 203 may be formed by, for example, spin-coating, lamination, deposition, or the like. The deposition may include chemical vapor deposition. The material of the top passivation layer 203 is illustrated in FIG. 1, and descriptions thereof are not repeated herein. The tiers 210, 220, 230, 240, 250 and the top passivation layer 203 together configure the multi-stacking carrier structure 200.

In some embodiments, before a thinning process of the substrate 101, the thickness ratio of the thickness TL of the multi-stacking carrier structure 200 to the thickness T0 of the substrate 101 may be between about 5:7 and about 1:1, or between about 1:1 and about 7:5.

Figure 20:
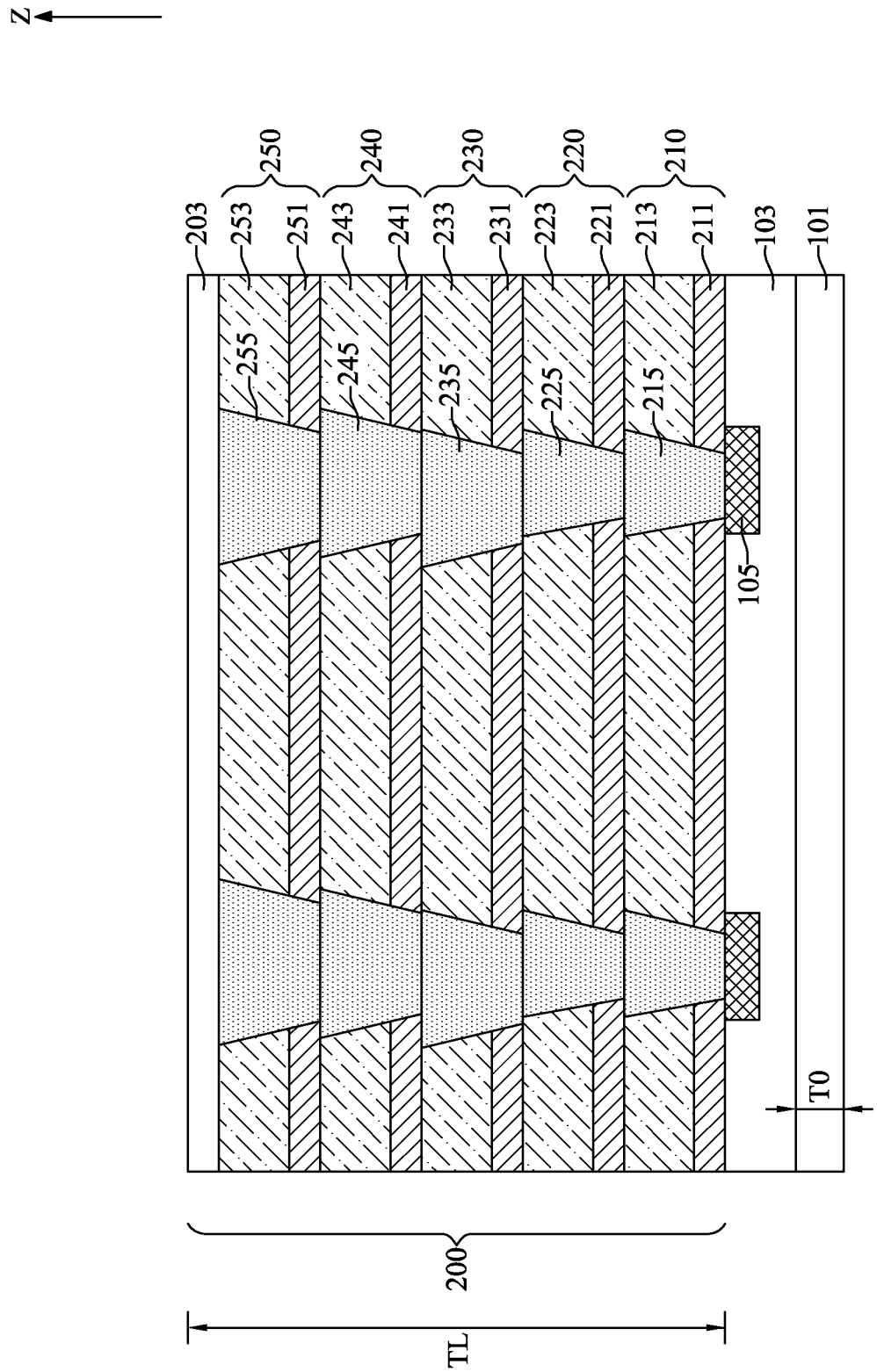
Figure 21:
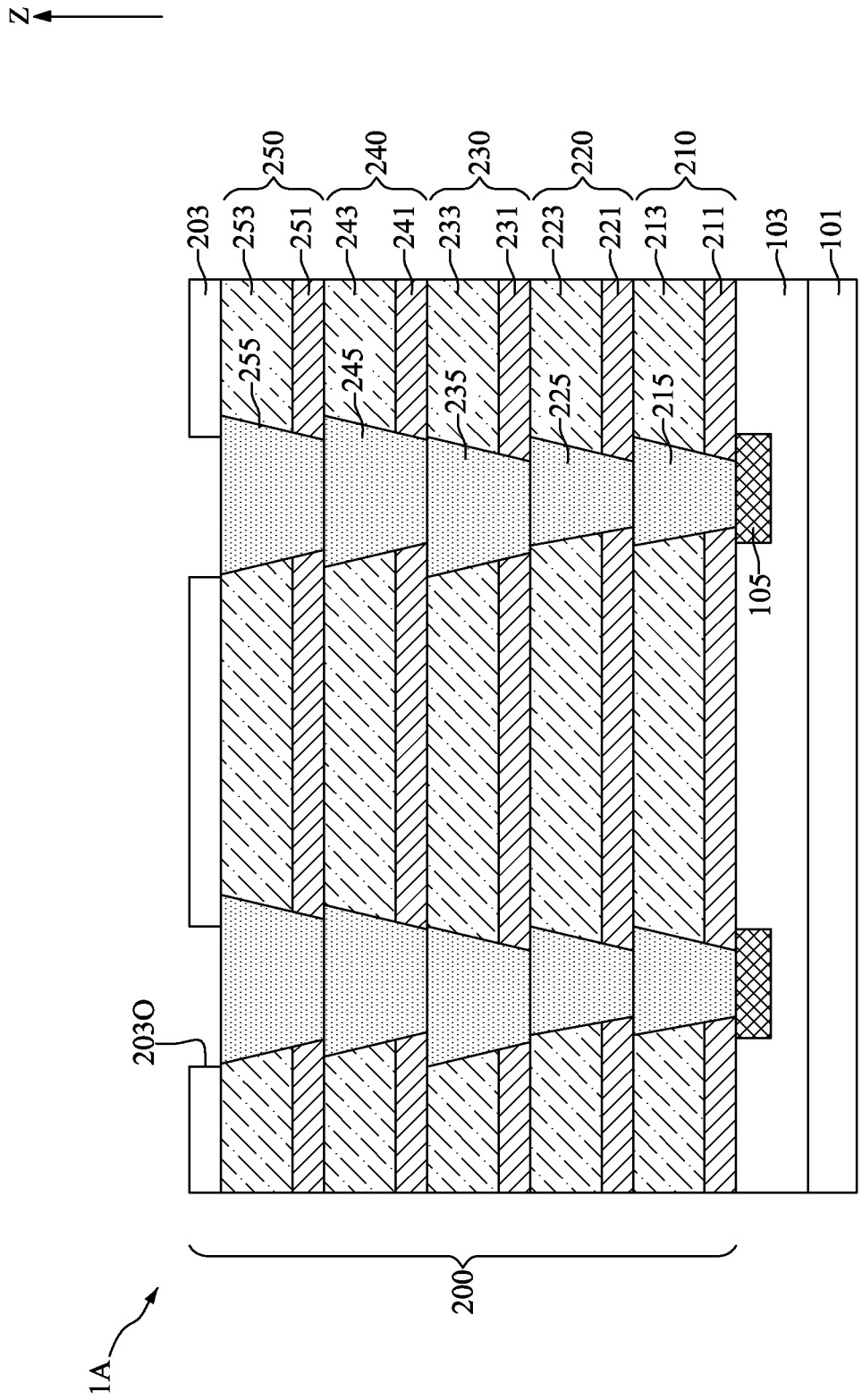

With reference to FIGS. 6, 20, and 21, at step S15, the substrate 101 may be thinned and a plurality of first top openings 203O may be formed along the top passivation layer 203 of the multi-stacking carrier structure 200.

With reference to FIG. 20, the substrate 101 may be thinned through a thinning process using wafer grinding, mechanical abrasion, polishing, or the like, or using chemical removal, such as a wet etch. It should be noted that there is no carrier needed during the thinning process. The multi-stacking carrier structure 200 may serve as a temporary carrier to assist the thinning process of the substrate 101.

With reference to FIG. 20, after the thinning process, the thickness ratio of the thickness TL of the multi-stacking carrier structure 200 to the thickness T0 of the substrate 101 may be between about 180:1 and about 50:1.

With reference to FIG. 21, the plurality of first top openings 203O may be formed along the top passivation layer 203 to expose the plurality of fifth vias 255, respectively and correspondingly. The exposed fifth vias 255 may be electrically coupled to probes for electrical characterization tests. That is, the performance of the semiconductor device 1A after the substrate is thinned may be easily analyzed.

Figure 22:
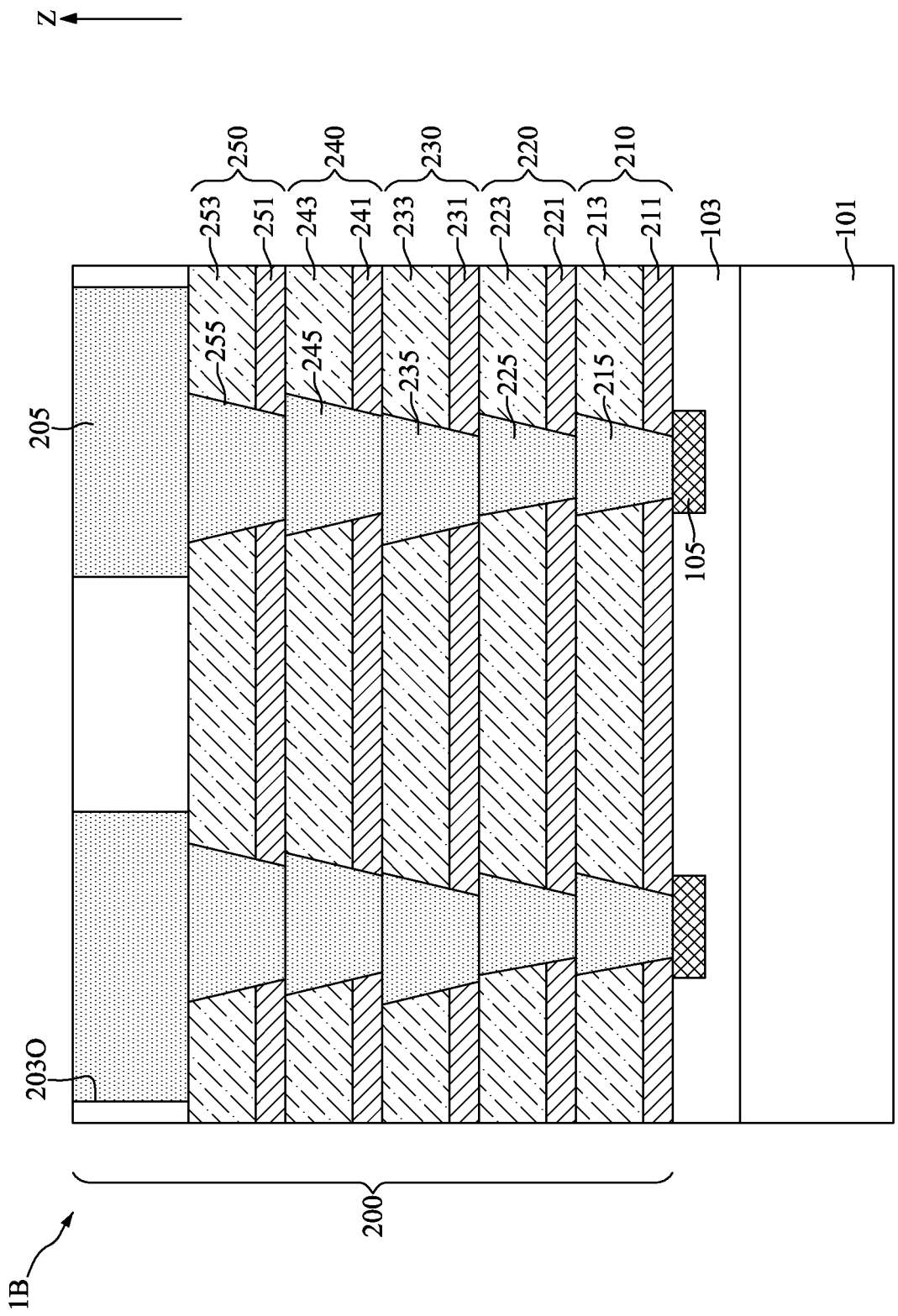
FIG. 22 illustrates, in a schematic cross-sectional view diagram, a flow for fabricating a semiconductor device in accordance with another embodiment of the present disclosure.

FIG. 22 illustrates, in a schematic cross-sectional view diagram, a flow for fabricating a semiconductor device 1B in accordance with another embodiment of the present disclosure.

With reference to FIG. 22, the semiconductor device 1B may have a structure similar to that illustrated in FIG. 21. The same or similar elements in FIG. 22 as in FIG. 21 have been marked with similar reference numbers and duplicative descriptions have been omitted.

In the semiconductor device 1B, the plurality of redistribution layers 205 may be formed on the plurality of fifth vias 255, respectively and correspondingly. In some embodiments, the formation of the plurality of redistribution layers 205 may include forming one or more insulation layers (i.e., the top passivation layer 203) using any suitable method (e.g., a spin-on coating technique, sputtering, and the like) and forming conductive features (i.e., the plurality of redistribution layers 205) in the insulation layers. The formation of the conductive features may include patterning the insulation layers (e.g., using photolithography and/or etching processes) and forming conductive features in the patterned insulation layers (e.g., by depositing a seed layer, using a mask layer to define the shape of the conductive features, and using an electroless/electrochemical plating process). For example, the plurality of first top openings 203O may define the pattern of the plurality of redistribution layers 205. The plurality of redistribution layers 205 may be formed in the plurality of first top openings 203O.

Figure 23:
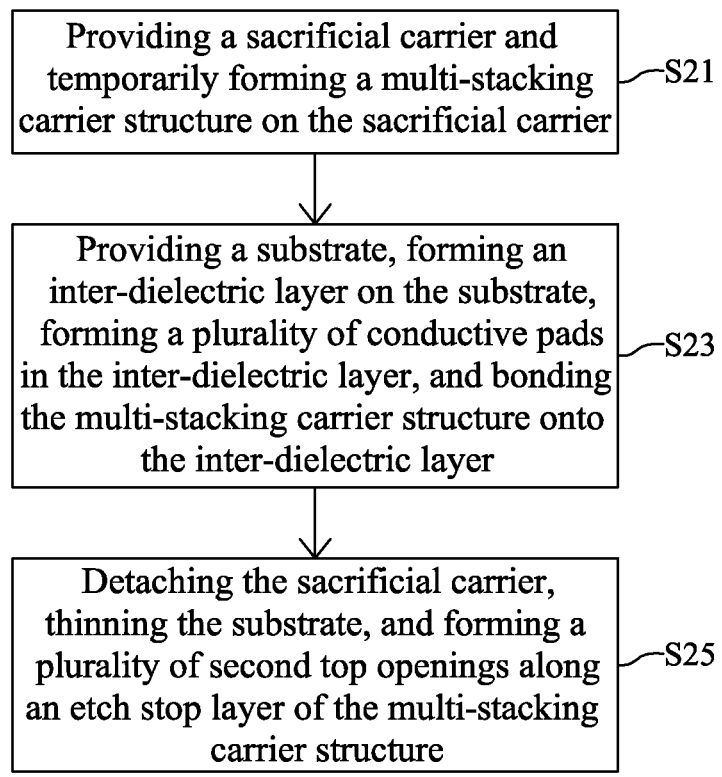
FIG. 23 illustrates, in a flowchart diagram form, a method for fabricating a semiconductor device in accordance with another embodiment of the present disclosure.

FIG. 23 illustrates, in a flowchart diagram form, a method 20 for fabricating a semiconductor device 1C in accordance with another embodiment of the present disclosure. FIGS. 24 to 32 illustrate, in schematic cross-sectional view diagrams, a flow for fabricating the semiconductor device 1C in accordance with another embodiment of the present disclosure.

With reference to FIGS. 23 to 27, at step S21, a sacrificial carrier 401 may be provided and a multi-stacking carrier structure 200 may be temporarily formed on the sacrificial carrier 401.

Figure 24:
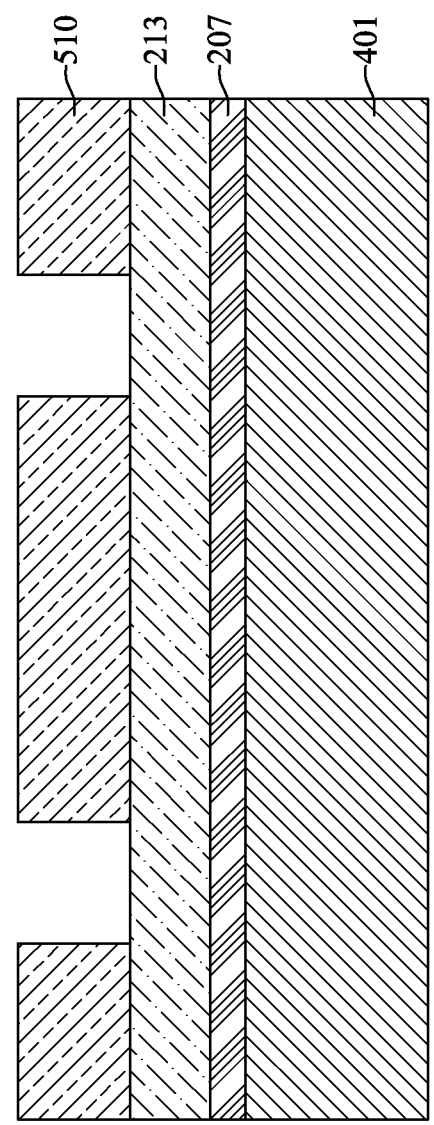
FIGS. 24 to 32 illustrate, in schematic cross-sectional view diagrams, a flow for fabricating the semiconductor device in accordance with another embodiment of the present disclosure.

With reference to FIG. 24, an etch stop layer 207 may be formed on the sacrificial carrier 401. Generally, the etch stop layer 207 may provide a mechanism to stop an etch process when forming conductive features. The etch stop layer 207 may be preferably formed of a dielectric material having a different etch selectivity from adjacent layers. For example, the etch stop layer 207 may be formed of silicon nitride, silicon carbonitride, silicon oxycarbide, or the like, and may be deposited by chemical vapor deposition or plasma enhanced chemical vapor deposition.

With reference to FIG. 24, a first insulating layer 213 may be formed on the etch stop layer 207 by, for example, deposition process such as chemical vapor deposition or plasma enhanced chemical vapor deposition. The material of the first insulating layer 213 is illustrated in FIG. 1, and descriptions thereof are not repeated herein. A first mask layer 510 may be formed on the first insulating layer 213. The first mask layer 510 may include a pattern which defines positions of a plurality of first vias 215.

Figure 25:
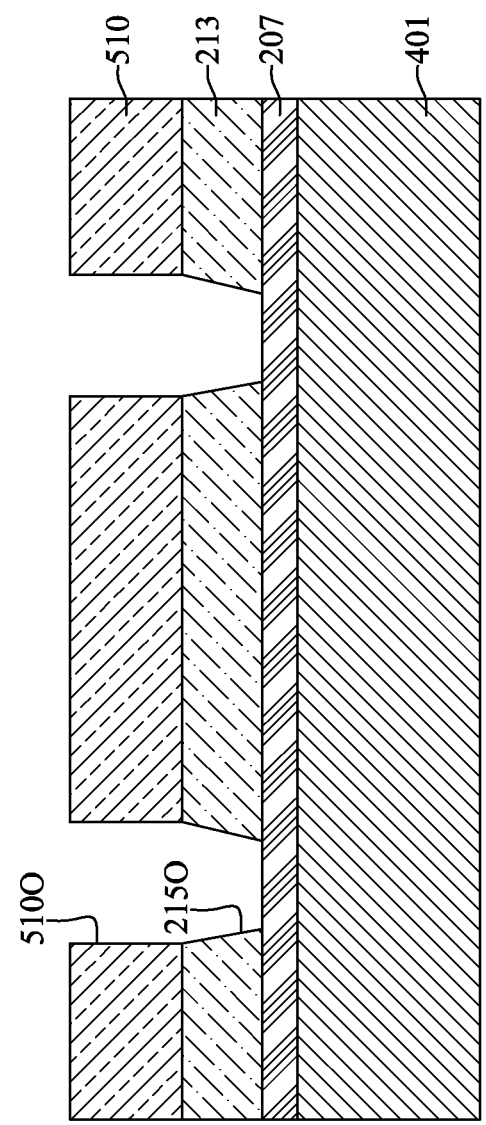

With reference to FIG. 25, an oxide etch process may be performed using the first mask layer 510 as the pattern guide to remove portions of the first insulating layer 213 and concurrently form the plurality of first via openings 215O. Portions of the etch stop layer 207 may be exposed through the plurality of first via openings 215O. The etch rate ratio of the first insulating layer 213 to the etch stop layer 207 may be between about 100:1 and about 1.05:1, between about 15:1 and about 2:1, or between about 10:1 and about 2:1 during the oxide etch process etch process. After, the oxide etch process, the first mask layer 510 may be removed.

Figure 26:
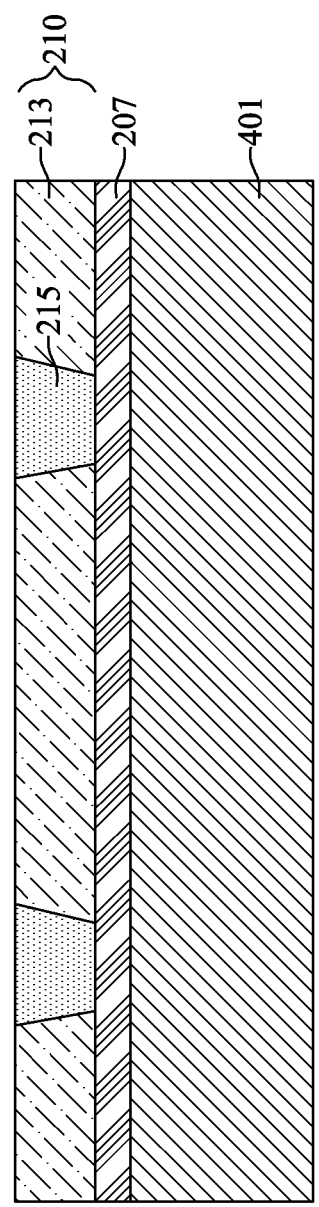

With reference to FIG. 26, a plurality of first vias 215 may be formed in the plurality of first via openings 215O. A planarization process, such as chemical mechanical polishing, may be performed until the top surface of the first insulating layer 213 is exposed to remove excess material and provide a substantially flat surface for subsequent processing steps. The material of the plurality of first vias 215 is illustrated in FIG. 1, and descriptions thereof are not repeated herein. The first insulating layer 213 and the plurality of first vias 215 together configure a first tier 210.

Figure 27:
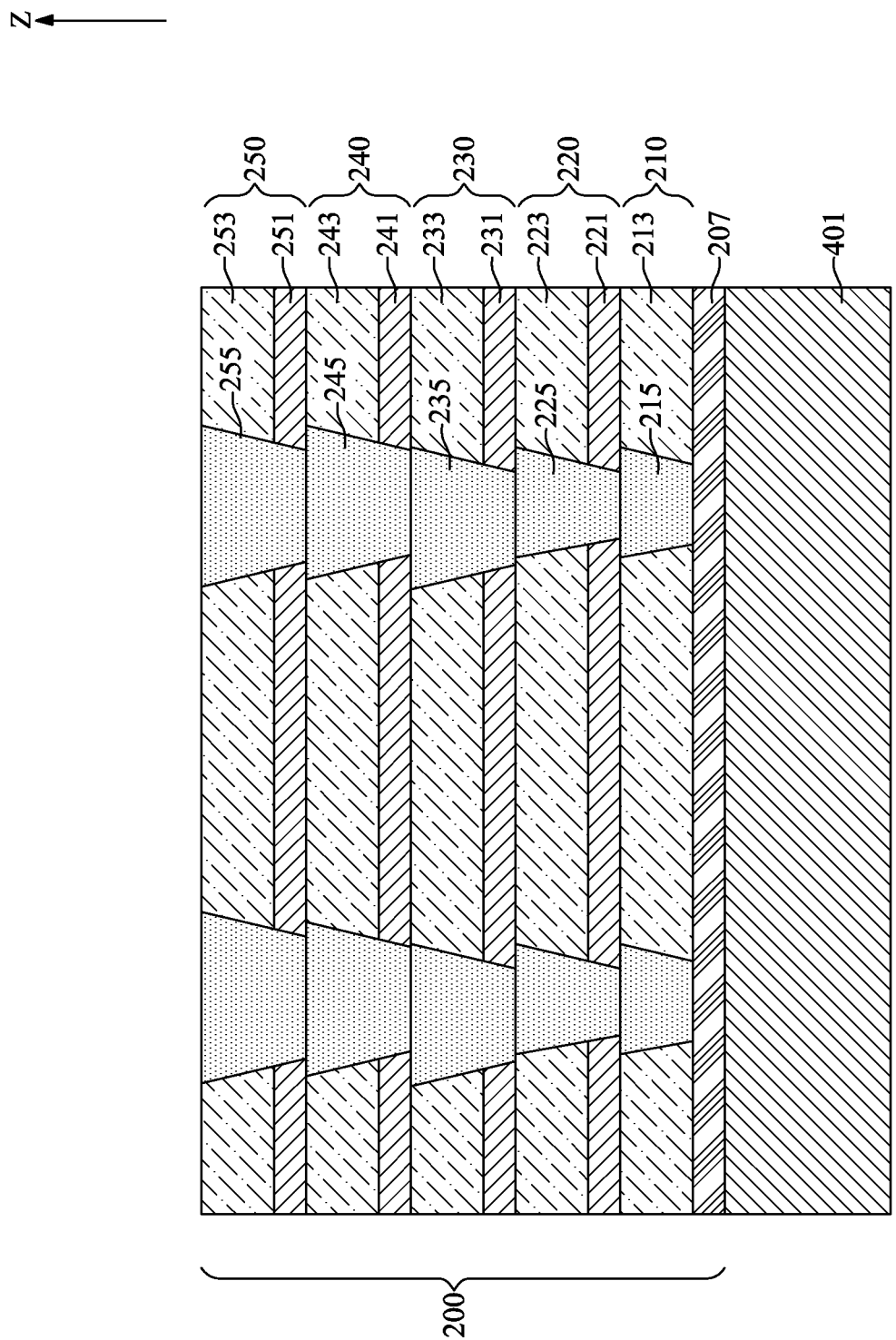

With reference to FIG. 27, the second tier 220, the third tier 230, the fourth tier 240, and the fifth tier 250 may be formed of a procedure similar to that illustrated in FIGS. 12 to 19, and descriptions thereof are not repeated herein. The first tier 210, the second tier 220, the third tier 230, the fourth tier 240, the fifth tier 250, and the etch stop layer 207 together configure the multi-stacking carrier structure 200.

Figure 28:
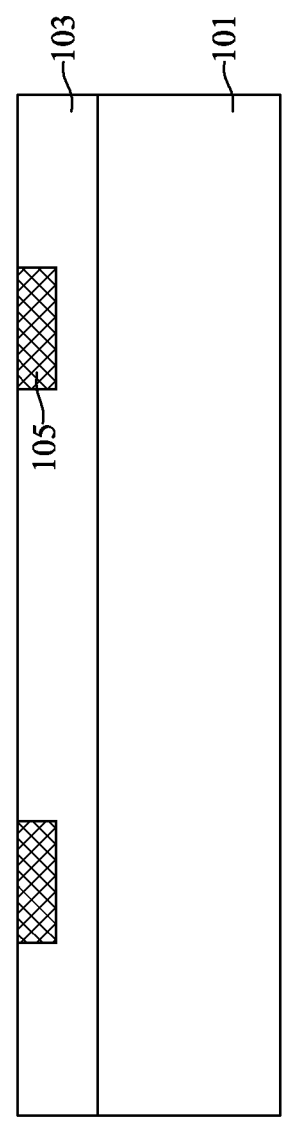
Figure 29:
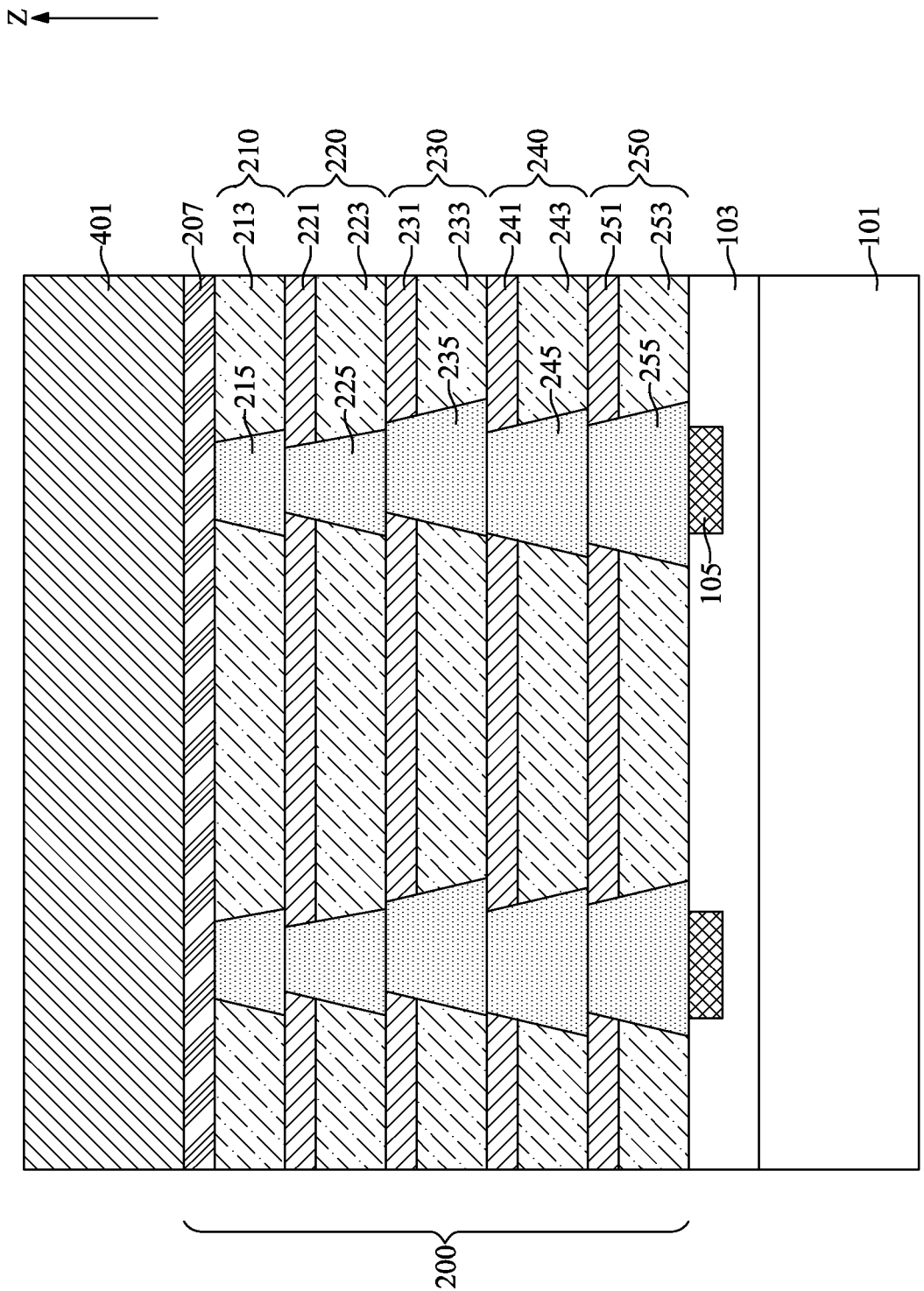

With reference to FIGS. 23, 28, and 29, at step S23, a substrate 101 may be provided, an inter-dielectric layer 103 may be formed on the substrate 101, a plurality of conductive pads 105 may be formed in the inter-dielectric layer 103, and the multi-stacking carrier structure 200 may be bonded onto the inter-dielectric layer 103.

With reference to FIG. 28, the substrate 101, the inter-dielectric layer 103, and the plurality of conductive pads 105 may be formed with a procedure similar to that illustrated in FIGS. 1 and 7, and descriptions thereof are not repeated herein.

With reference to FIG. 29, the multi-stacking carrier structure 200 may be flipped and bonded onto the inter-dielectric layer 103. In some embodiments, the multi-stacking carrier structure 200 may be bonded onto the inter-dielectric layer 103 through a hybrid bonding process. In some embodiments, the hybrid bonding process such as thermo-compression bonding, passivation-capping-layer assisted bonding, or surface activated bonding. In some embodiments, the process pressure of the hybrid bonding process may be between about 100 MPa and about 150 MPa. In some embodiments, the process temperature of the hybrid bonding process may be between about room temperature (e.g., 25° C.) and about 400° C. In some embodiments, surface treatments such as wet chemical cleaning and gas/vapor-phase thermal treatments may be used to lower the process temperature of the hybrid bonding process or to short the time consuming of the hybrid bonding process. In some embodiments, the hybrid bonding process may include, for example, dielectric-to-dielectric bonding, metal-to-metal bonding, and metal-to-dielectric bonding. In some embodiments, a thermal annealing process may be performed after the bonding process to enhance dielectric-to-dielectric bonding and to induce thermal expansion of metal-to-metal bonding so as to further improve the bonding quality.

Figure 30:
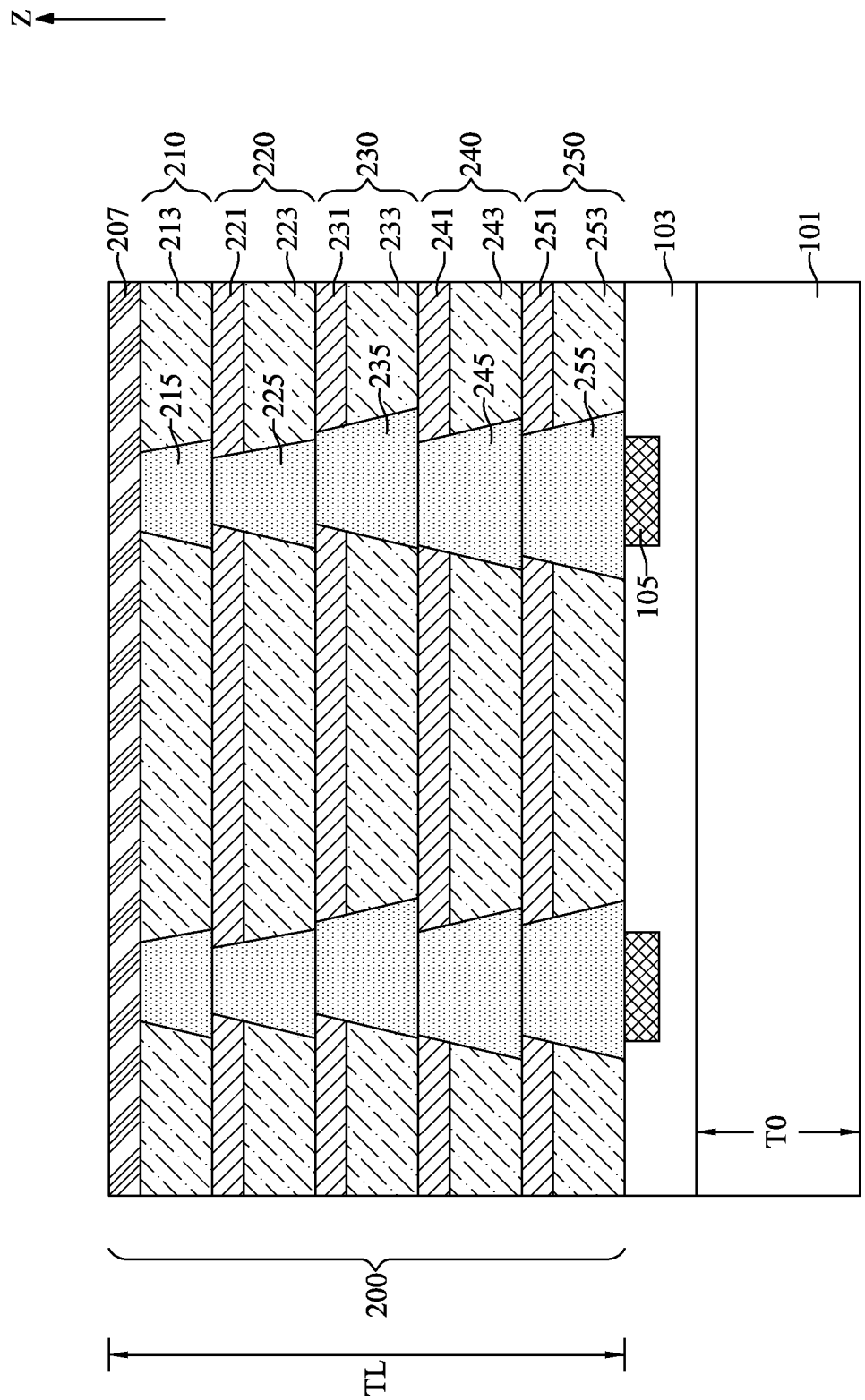

With reference to FIG. 30, before a thinning process of the substrate 101, in some embodiments, the thickness ratio of the thickness TL of the multi-stacking carrier structure 200 to the thickness T0 of the substrate 101 may be between about 5:7 and about 1:1, or between about 1:1 and about 7:5.

With reference to FIG. 23 and FIGS. 30 to 32, at step S25, the sacrificial carrier 401 may be detached, the substrate 101 may be thinned, and a plurality of second top openings 207O may be formed along the etch stop layer 207 of the multi-stacking carrier structure 200.

With reference to FIG. 30, the sacrificial carrier 401 may be detached from the etch stop layer 207.

Figure 31:
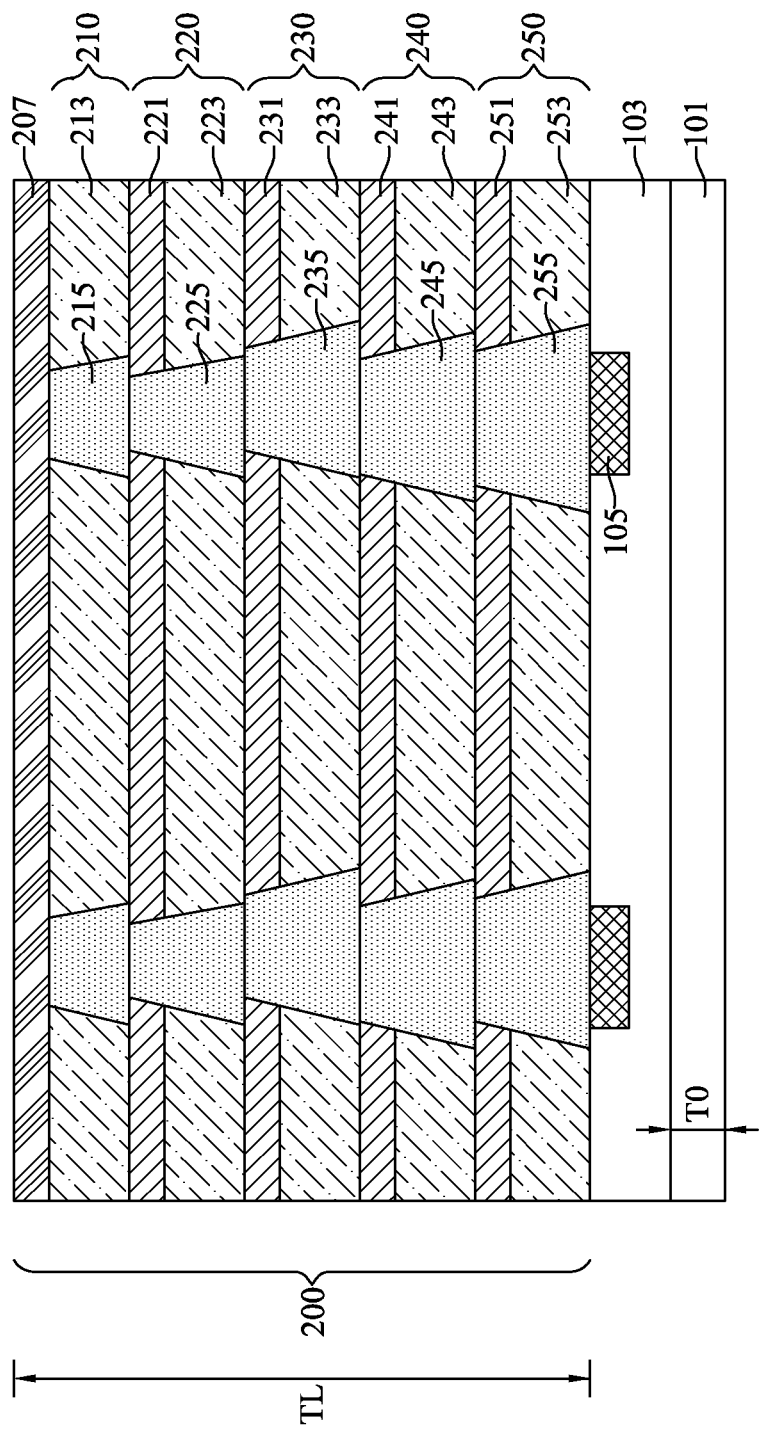

With reference to FIG. 31, the substrate 101 may be thinned through a thinning process using wafer grinding, mechanical abrasion, polishing, or the like, or using chemical removal, such as a wet etch. It should be noted that there is no carrier needed during the thinning process. The multi-stacking carrier structure 200 may serve as a temporary carrier to assist the thinning process of the substrate 101.

With reference to FIG. 31, after the thinning process of the substrate 101, the thickness ratio of the thickness TL of the multi-stacking carrier structure 200 to the thickness T0 of the substrate 101 may be between about 180:1 and about 50:1.

Figure 32:
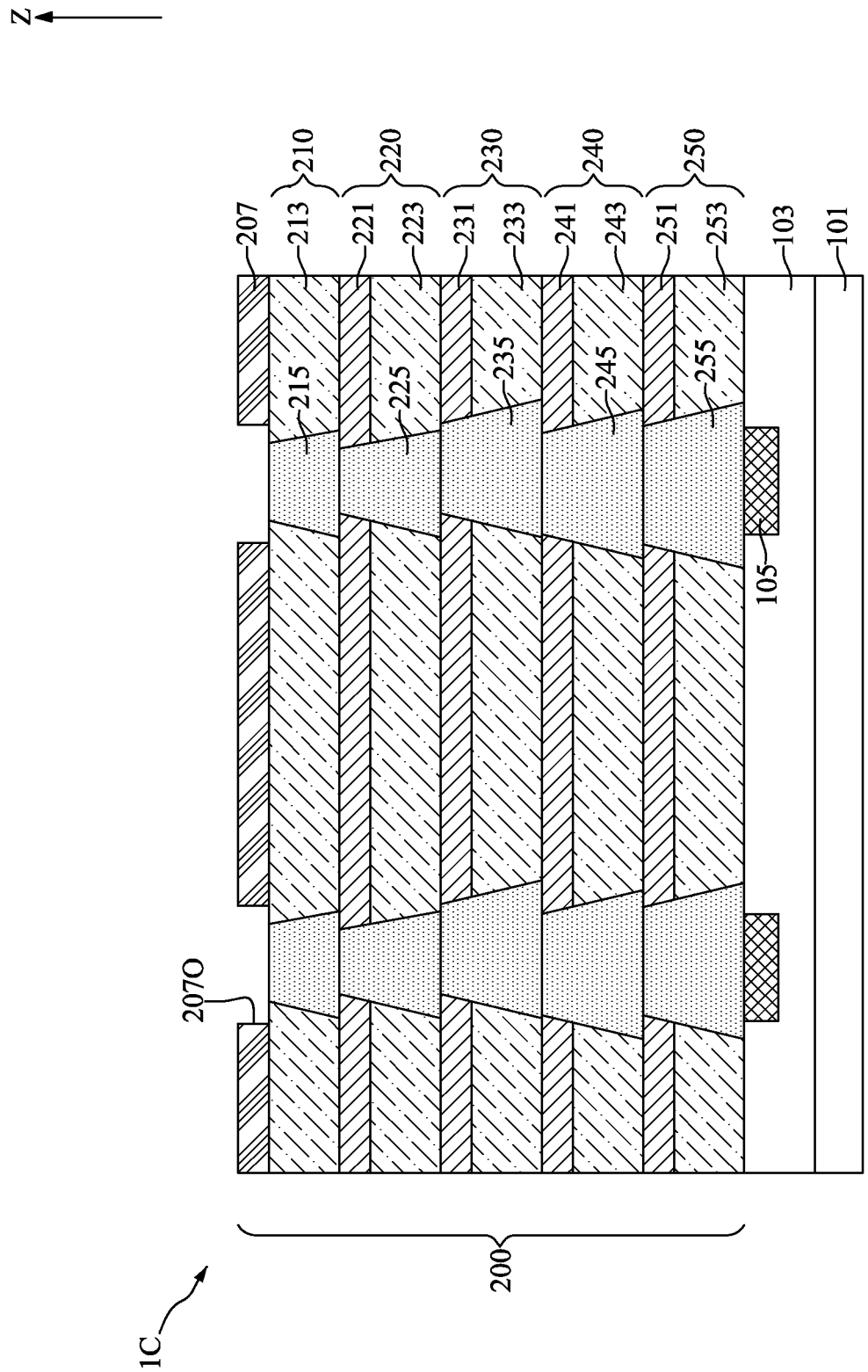

With reference to FIG. 32, a plurality of second top openings 207O may be formed along the etch stop layer 207 to expose the plurality of first vias 215, respectively and correspondingly. The exposed first vias 215 may be electrically coupled to probes for electrical characterization tests. That is, the performance of the semiconductor device 1C after the substrate is thinned may be easily analyzed.

Figure 33:
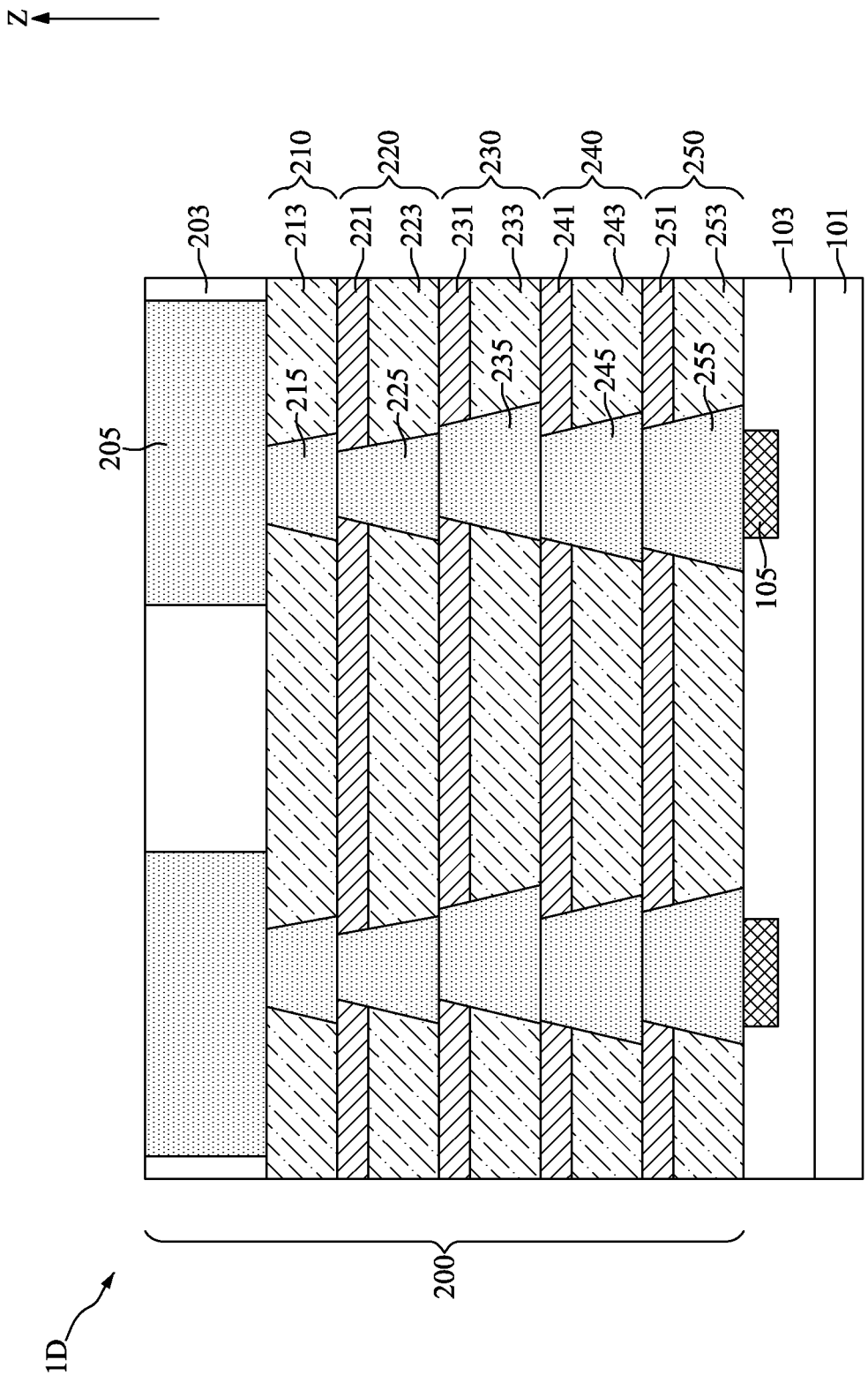
FIG. 33 illustrates, in a schematic cross-sectional view diagram, a flow for fabricating a semiconductor device in accordance with another embodiment of the present disclosure.

FIG. 33 illustrates, in a schematic cross-sectional view diagram, a flow for fabricating a semiconductor device 1D in accordance with another embodiment of the present disclosure.

With reference to FIG. 33, the semiconductor device 1D may have a structure similar to that illustrated in FIG. 31. The same or similar elements in FIG. 32 as in FIG. 31 have been marked with similar reference numbers and duplicative descriptions have been omitted.

In the semiconductor device 1D, the etch stop layer 207 may be completely removed. A top passivation layer 203 may be formed on the first tier 210 with a procedure similar to that illustrated in FIG. 19, and descriptions thereof are not repeated herein. A plurality of redistribution layers 205 may be formed along the top passivation layer 203 and on the plurality of first vias 215, respectively and correspondingly. The plurality of redistribution layers 205 may re-route the plurality of first vias 215 to provide more flexible configuration and more contacting area for electrical characterization tests. The material of the plurality of redistribution layers 205 is illustrated in FIG. 3, and descriptions thereof are not repeated herein.

One aspect of the present disclosure provides a semiconductor device including a substrate; an inter-dielectric layer positioned on the substrate; a conductive pad positioned in the inter-dielectric layer; and a multi-stacking carrier structure comprising a first tier comprising a first passivation layer positioned on the inter-dielectric layer, a first insulating layer positioned on the first passivation layer, and a first via positioned along the first passivation layer and the first insulating layer, and electrically connected to the conductive pad; a second tier positioned on the first tier and comprising a second passivation layer positioned on the first insulating layer, a second insulating layer positioned on the second passivation layer, and a second via positioned along the second passivation layer and the second insulating layer, and electrically connected to the first via; and a third tier positioned on the second tier and comprising a third passivation layer positioned on the second insulating layer, a third insulating layer positioned on the third passivation layer, and a third via positioned along the third passivation layer and the third insulating layer, and electrically connected to the second via.

Another aspect of the present disclosure provides a multi-stacking carrier structure including an etch stop layer; a first tier comprising a first passivation layer positioned on the etch stop layer, a first insulating layer positioned on the first passivation layer, and a first via positioned along the first passivation layer and the first insulating layer; a second tier positioned on the first tier and comprising a second passivation layer positioned on the first insulating layer, a second insulating layer positioned on the second passivation layer, and a second via positioned along the second passivation layer and the second insulating layer, and electrically connected to the first via; and a third tier positioned on the second tier and comprising a third passivation layer positioned on the second insulating layer, a third insulating layer positioned on the third passivation layer, and a third via positioned along the third passivation layer and the third insulating layer, and electrically connected to the second via.

Another aspect of the present disclosure provides a method for fabricating a semiconductor device including providing a substrate; forming an inter-dielectric layer on the substrate; forming a conductive pad in the inter-dielectric layer; forming a first tier on the inter-dielectric layer, wherein the first tier comprises a first passivation layer on the inter-dielectric layer, a first insulating layer on the first passivation layer, and a first via along the first passivation layer and the first insulating layer, and electrically connected to the conductive pad; forming a second tier on the first tier, wherein the second tier comprises a second passivation layer on the first insulating layer, a second insulating layer on the second passivation layer, and a second via along the second passivation layer and the second insulating layer, and electrically connected to the first via; and forming a third tier on the second tier, wherein the third tier comprises a third passivation layer on the second insulating layer, a third insulating layer on the third passivation layer, and a third via along the third passivation layer and the third insulating layer, and electrically connected to the second via. The first tier, the second tier, and the third tier together configure a multi-stacking carrier structure.

Another aspect of the present disclosure provides a method for fabricating a semiconductor device including providing a sacrificial carrier; temporarily attaching an etch stop layer on the sacrificial carrier; forming a multi-stacking carrier structure on the etch stop layer, wherein the multi-stacking carrier structure comprises a first tier on the etch stop layer, a second tier on the first tier, and a third tier on the second tier; providing a substrate; forming an inter-dielectric layer on the substrate; forming a conductive pad in the inter-dielectric layer; flipping the multi-stacking carrier structure and bonding the multi-stacking carrier structure onto the inter-dielectric layer; detaching the sacrificial carrier from the etch stop layer; and thinning the substrate.

Due to the design of the semiconductor device of the present disclosure, the multi-stacking carrier structure 200 may serve as a temporary carrier to assist a thinning process of the substrate 101. Therefore, no carrier is needed during the thinning process of the substrate 101. As a result, the cost of fabricating of the semiconductor device 1A may be reduced. In addition, after the thinning process, the multi-stacking carrier structure 200 may provide an electrical path connecting to device elements of the semiconductor device 1A. As a result, the performance of the semiconductor device 1A may be easily analyzed in the presence of the multi-stacking carrier structure 200.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
    a substrate;
    an inter-dielectric layer positioned on the substrate;
    a conductive pad positioned in the inter-dielectric layer; and
    a multi-stacking carrier structure comprising:
        a first tier comprising a first passivation layer positioned on the inter-dielectric layer, a first insulating layer positioned on the first passivation layer, and a first via positioned along the first passivation layer and the first insulating layer, and electrically connected to the conductive pad;
        a second tier positioned on the first tier and comprising a second passivation layer positioned on the first insulating layer, a second insulating layer positioned on the second passivation layer, and a second via positioned along the second passivation layer and the second insulating layer, and electrically connected to the first via; and
        a third tier positioned on the second tier and comprising a third passivation layer positioned on the second insulating layer, a third insulating layer positioned on the third passivation layer, and a third via positioned along the third passivation layer and the third insulating layer, and electrically connected to the second via;
        wherein a thickness ratio of a thickness of the multi-stacking carrier structure to a thickness of the substrate is between about 180:1 and about 50:1.

2. The semiconductor device of claim 1, wherein a thickness of the multi-stacking carrier structure is greater than about 500 micrometers.

3. The semiconductor device of claim 2, wherein a thickness of the first insulating layer is less than about 200 micrometers.

4. The semiconductor device of claim 2, wherein a thickness of the first passivation layer is between about 1 micrometer and about 2 micrometers.

5. The semiconductor device of claim 2, wherein a width of a top surface of the first via is less than a width of a top surface of the second via.

6. The semiconductor device of claim 2, wherein a width of a top surface of the second via is less than a width of a top surface of the third via.

7. The semiconductor device of claim 2, wherein a thickness of the substrate is less than about 200 micrometers.

8. The semiconductor device of claim 2, wherein a thickness of the substrate is less than about 5 micrometers.

9. The semiconductor device of claim 2, wherein the first passivation layer comprises an oxide material.

10. The semiconductor device of claim 2, further comprising a top passivation layer positioned on the third insulating layer of the third tier.

11. The semiconductor device of claim 10, further comprising a first top opening positioned along the top passivation layer to expose the third via.

12. The semiconductor device of claim 1, wherein the first insulating layer comprises an oxide material.

13. The semiconductor device of claim 1, wherein a sidewall of the first via is tapered and a width of a top surface of the first via is greater than a width of a bottom surface of the first via.

14. The semiconductor device of claim 1, wherein the first via comprises a filler layer positioned along the first insulating layer and the first passivation layer, and on the conductive pad, and an isolation layer positioned between the filler layer and the first insulating layer, and between the filler layer and the first passivation layer.

15. The semiconductor device of claim 14, wherein the first via comprises a barrier layer positioned between the filler layer and the isolation layer, and between the filler layer and the conductive pad.

16. The semiconductor device of claim 15, wherein the first via comprises an adhesion layer positioned between the filler layer and the barrier layer.

17. The semiconductor device of claim 16, wherein the first via comprises a seed layer positioned between the filler layer and the adhesion layer.

18. The semiconductor device of claim 1, wherein the multi-stacking carrier structure comprises a redistribution layer positioned on the third via and electrically coupled to the conductive pad through the third via, the second via, and the first via.

* * * * *